(12) United States Patent
Seo et al.

(10) Patent No.: US 10,159,156 B2
(45) Date of Patent: Dec. 18, 2018

(54) MOBILE TERMINAL

(71) Applicant: LG ELECTRONICS INC., Seoul (KR)

(72) Inventors: Junghong Seo, Seoul (KR); Byoungchul Kim, Seoul (KR); Donghyuk Cho, Seoul (KR); Jaejun Jung, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 35 days.

(21) Appl. No.: 15/390,357

(22) Filed: Dec. 23, 2016

(65) Prior Publication Data

US 2017/0347470 A1    Nov. 30, 2017

(30) Foreign Application Priority Data

May 27, 2016    (KR) .................. 10-2016-0065511

(51) Int. Cl.

| | |
|---|---|
| *G06F 1/16* | (2006.01) |
| *H05K 5/00* | (2006.01) |
| *H05K 5/02* | (2006.01) |
| *H01Q 1/24* | (2006.01) |
| *H04B 1/3888* | (2015.01) |
| *H04M 1/02* | (2006.01) |
| *H04M 1/18* | (2006.01) |

(52) U.S. Cl.
CPC ......... *H05K 5/0086* (2013.01); *G06F 1/1626* (2013.01); *G06F 1/1656* (2013.01); *H01Q 1/243* (2013.01); *H04B 1/3888* (2013.01); *H04M 1/0202* (2013.01); *H04M 1/185* (2013.01); *H05K 5/0004* (2013.01); *H05K 5/0017* (2013.01); *H05K 5/0217* (2013.01); *H04M 1/0274* (2013.01)

(58) Field of Classification Search
CPC ......... G06F 1/16; G06F 1/1601; G06F 1/1626
See application file for complete search history.

(56) References Cited

U.S. PATENT DOCUMENTS

| | | | | |
|---|---|---|---|---|
| 8,772,650 | B2 * | 7/2014 | Merz ..................... | G06F 1/1656 174/50 |
| 9,326,391 | B2 * | 4/2016 | Woodhull ............ | H05K 5/0004 |
| 9,363,343 | B2 * | 6/2016 | Rao ...................... | H04M 1/0274 |
| 2009/0017263 | A1 * | 1/2009 | Yeates ................... | B22D 19/04 428/167 |
| 2009/0262029 | A1 * | 10/2009 | Chiang ................ | H01Q 1/2266 343/702 |

(Continued)

FOREIGN PATENT DOCUMENTS

| | | |
|---|---|---|
| CN | 201878437 U | 6/2011 |
| EP | 2621017 A1 | 7/2013 |

*Primary Examiner* — Anthony Q Edwards
(74) *Attorney, Agent, or Firm* — Birch, Stewart, Kolasch & Birch, LLP

(57) ABSTRACT

A mobile terminal can include a display; a case including a conductive member having a first section and a second section, the first section having a first lateral surface and the second section having a second lateral surface; a dielectric member separating the first section from the second section; a gap formed between the first lateral surface and the second lateral surface; and a first cavity extending into the first lateral surface of the first section, in which the dielectric member fills the gap and the first cavity.

19 Claims, 38 Drawing Sheets

(56) References Cited

U.S. PATENT DOCUMENTS

| | | | |
|---|---|---|---|
| 2012/0157175 A1* | 6/2012 | Golko | G06F 1/1698 |
| | | | 455/575.7 |
| 2014/0060917 A1* | 3/2014 | Woodhull | H05K 5/0004 |
| | | | 174/520 |
| 2016/0028151 A1* | 1/2016 | Tsai | B21D 5/00 |
| | | | 343/702 |
| 2016/0065703 A1* | 3/2016 | Rao | H04M 1/0274 |
| | | | 455/575.8 |
| 2017/0309991 A1* | 10/2017 | Noori | H01Q 1/243 |

* cited by examiner

MOBILE TERMINAL

This application claims the benefit of Korean Patent Application No. 10-2016-0065511 filed in the Republic of Korea on May 27, 2016, the entire contents of which are incorporated herein by reference for all purposes as if fully set forth herein.

BACKGROUND OF THE INVENTION

Field of the Invention

The present invention relates to a mobile terminal including a case having a dielectric member filled in a cavity formed in a slit of a metal cover.

Background of the Related Art

The terminal may be divided into a mobile/portable terminal and a stationary terminal depending on whether movement is possible. The mobile terminal again can be divided into a handheld terminal and a vehicle mounted terminal The functions of the mobile terminal are diversified and include data and voice communications, photographing, video recording, and voice recording via a camera, playing music files via a speaker system, and outputting image or video on a display unit. Some mobile terminals add electronic game play features, or perform or a multimedia player. Recent mobile terminals can receive a multicast signal for providing a visual content, such as broadcast and video or television programs.

As the functions of the mobile terminal are being diversified, for example, the mobile terminal is implemented as a multimedia player with multiple functions such as photographing of photos or video, playing music or video files, or reception of games and broadcasting.

A case of the mobile terminal may be a cover formed of metal. A slit can be formed in the cover for the radio transmission and reception of an antenna of the mobile terminal. However, the slits formed in the cover are filled with a dielectric. The boundary of the dielectric and the cover are vulnerable to an external impact, since the impacted area may include different materials. In order to address these issues, a configuration for enhancing the bonding strength between the dielectric and the cover may be applied to the mobile terminal.

SUMMARY OF THE INVENTION

An object of the present invention is to solve the foregoing problems and other problems.

Another object of the present invention is to provide a mobile terminal constituting a case of which a dielectric member is filled in a cavity formed in a slit of a metal cover.

According to an aspect of the present invention to achieve the above or other objects, the present invention provides a mobile terminal including a display unit; and a case, the display unit is located in front of the case, wherein the case includes a conductive cover having an interior surface, an exterior surface, and a thickness surface extended toward the exterior surface from an end portion of the interior surface, and a dielectric member, located in an opening formed on the conductive cover, wherein a cavity is formed on the thickness surface at the opening, and the dielectric member fills the opening and the cavity.

According to another aspect, the present invention provides a method for manufacturing a case of a mobile terminal including manufacturing a conductive cover, an opening is formed on the conductive cover, wherein the conductive cover includes an interior surface, an exterior surface, and a thickness surface extended toward the exterior surface from the interior surface; forming a cavity on the thickness surface at the opening; and injecting a dielectric member into the opening and the cavity.

Additional scope of applicability of the present invention becomes apparent from detailed description below. However, various changes and modifications within the spirit and scope of the present invention may be clearly understood by those skilled in the art, thereby specific embodiments, such as the following detailed description and preferred embodiment of the present invention are to be understood as only given example.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
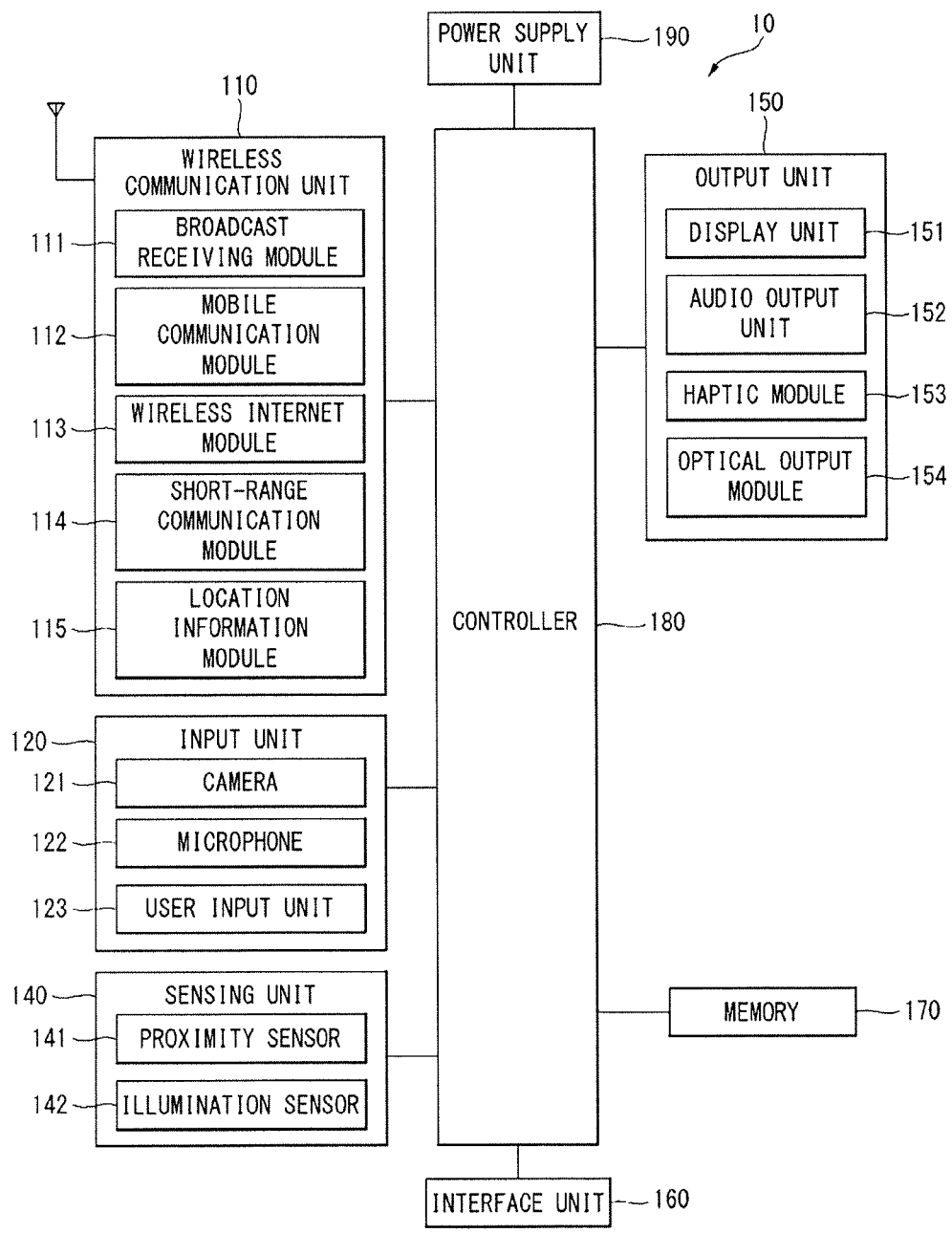
FIG. 1 is a block diagram illustrating a mobile terminal according to the embodiment of the present invention.

Reference will now be made in detail embodiments of the invention, examples of which are illustrated in the accompanying drawings. Since the present invention may be modified in various ways and may have various forms, specific embodiments are illustrated in the drawings and are described in detail in the present specification. However, it should be understood that the present invention is not limited to specific disclosed embodiments, but includes all modifications, equivalents and substitutes included within the spirit and technical scope of the present invention.

The terms "first," "second," etc. may be used to describe various components, but the components are not limited by such terms. The terms are used only for the purpose of distinguishing one component from other components. For example, a first component may be designated as a second component without departing from the scope of the present invention. In the same manner, the second component may be designated as the first component.

The term "and/or" encompasses both combinations of the plurality of related items disclosed and any item from among the plurality of related items disclosed. When an arbitrary component is described as "being connected to" or "being linked to" another component, this should be understood to mean that still another component(s) may exist between them, although the arbitrary component may be directly connected to, or linked to, the second component. In contrast, when an arbitrary component is described as "being directly connected to" or "being directly linked to" another component, this should be understood to mean that no component exists between them.

The terms used in the present application are used to describe only specific embodiments or examples, and are not intended to limit the present invention. A singular expression can include a plural expression as long as it does not have an apparently different meaning in context.

In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Unless otherwise specified, all of the terms which are used herein, including the technical or scientific terms, have the same meanings as those that are generally understood by a person having ordinary knowledge in the art to which the present invention pertains. The terms defined in a generally used dictionary must be understood to have meanings identical to those used in the context of a related art, and are not to be construed to have ideal or excessively formal meanings unless they are obviously specified in the present application.

The following embodiments of the present invention are provided to those skilled in the art in order to describe the present invention more completely. Accordingly, shapes and sizes of elements shown in the drawings may be exaggerated for clarity.

The mobile terminal described in the present disclosure may include a mobile phone, a smart phone, a laptop computer, a digital broadcasting terminal, a PDA (personal digital assistants), a PMP (portable multimedia player), a navigation, a slate PC, a tablet PC, an ultra book, a wearable device, for example, a smartwatch, a smart glass, a HMD (head mounted display), etc. However, a configuration according to an embodiment of the present invention may be applied to a fixed terminal such as a digital TV, a desktop computer, a digital signage.

The coordinate system used in the present disclosure is a Cartesian coordinate system as an orthogonal coordinate system. For example, the coordinate system used in the present disclosure is an XYZ coordinate system. The XYZ coordinate system used in the present disclosure is left handed direction. That is, when a left hand winds the Z-axis from the X-axis to the Y-axis, a direction of a thumb of the left hand is pointing in the Z-axis.

Figure 2:
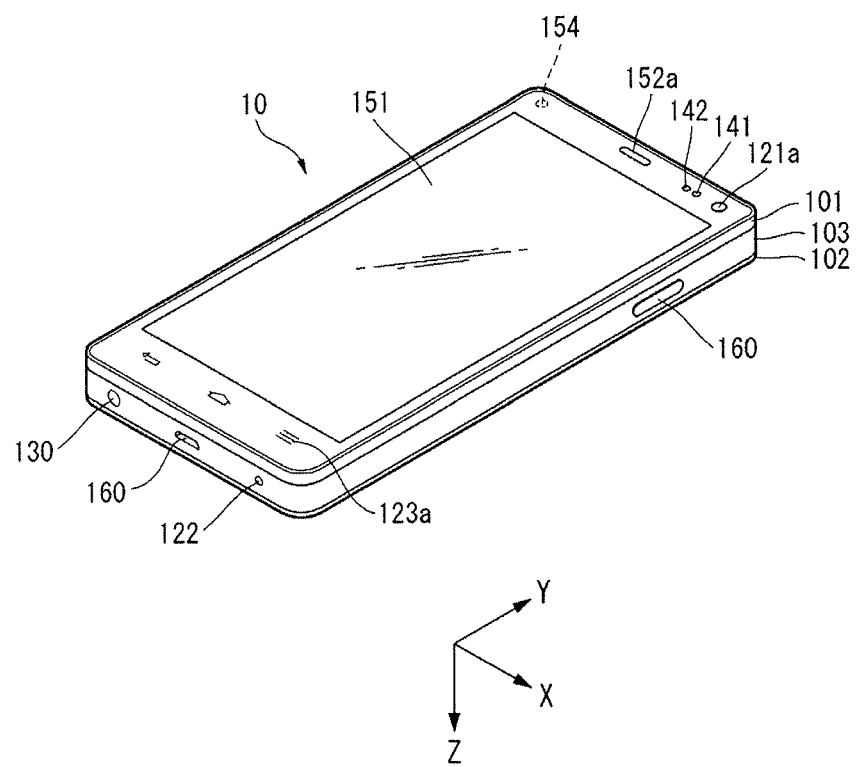
FIGS. 2 and 3 are conceptual diagrams viewing in different directions an example of a mobile terminal according to the embodiment of the present invention.
Figure 3:
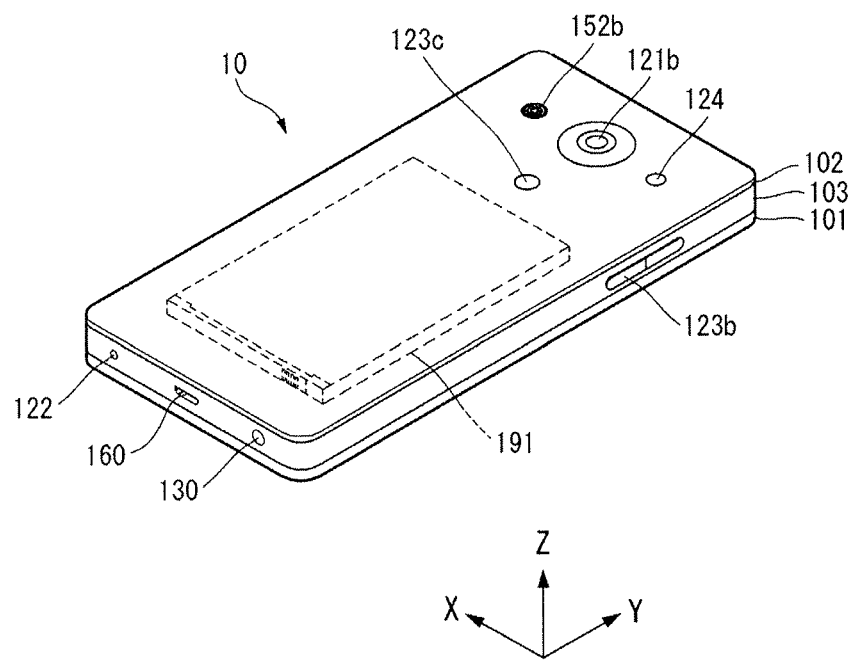

Referring to FIGS. 1 to 3, FIG. 1 is a block diagram illustrating a mobile terminal according to an embodiment of the present invention, and FIGS. 2 and 3 are conceptual diagrams viewing in different directions an example of a mobile terminal according to an embodiment of the present invention.

As shown, the mobile terminal 10 includes a wireless communication unit 110, an input unit 120, a sensing unit 140, an output unit 150, an interface unit 160, a memory 170, a controller 180 and power supply unit 190. The components shown in FIG. 1 do not limit the mobile terminal, thus, the mobile terminal described herein may include greater components than the components listed above, or may include fewer components.

More specifically, the wireless communication unit 110 in the above components may include one or more modules that enable wireless communication between the mobile terminal 10 and a wireless communication system, between the mobile terminal 10 and other mobile terminals 10, or between the mobile terminal 10 and an external server. Further, the wireless communication unit 110 may include one or more modules that connect the mobile terminal 10 to one or more networks.

The wireless communication unit 110 includes at least one of a broadcast receiving module 111, a mobile communication module 112, a wireless Internet module 113, a short-range communication module 114, and a location information module 115. The input part 120 may include a camera 121 or a video input for inputting video signal, a microphone 122 or an audio input for inputting audio signal, a user input unit 123, for example, a touch key, a mechanical key, etc., for inputting information from a user. Voice data or image data collected by the input unit 120 can be analyzed and be processed by a control command of the user.

The sensing unit 140 includes at least one sensor for sensing at least one of information within a mobile terminal, environment information surrounding the mobile terminal and user information. For example, the sensing unit 140 may include at least one of a proximity sensor 141, an illumination sensor 142, a touch sensor, an acceleration sensor, a magnetic sensor, a G-sensor, a gyroscope sensor, a motion sensor, an RGB sensor, an infrared sensor, a finger scan sensor, an ultrasonic sensor, an optical sensor (for example, a camera 121), a microphone 122, a battery gauge, an environmental sensor (for example, a barometer, a hygrometer, a thermometer, a radiation sensor, a thermal sensor, a gas sensor, etc.), a chemical sensor (for example, an electronic nose, a healthcare sensor, a biometric sensor, etc.). Meanwhile, by combining information sensed in the at least two sensors of these sensors, the mobile terminal disclosed herein may utilize the information.

The output unit 150 for generating an output related to visual, auditory or tactile sense may include at least one of a display unit 151, an audio output unit 152, a haptic module 153, and an optical output unit 154. The display unit 151 can implement a touch screen by being formed integrally with a touch sensor or being a cross-layer structure. The touch screen may function as the user input unit 123 that provides an input interface between the mobile terminal 10 and the user, at the same time, and provide an output interface between the mobile terminal 10 and the user.

The interface unit 160 can perform a role of a passage with a variety of external devices connected to the mobile terminal 10. The interface unit 160 may include at least one of a wire/wireless headset port, an external charger port, a wire/wireless data port, a memory card port, a port connecting a device equipped with a identification module, an audio I/O (Input/Output) port, a video I/O (Input/Output) port, and an earphone port. The mobile terminal 10, in response to the external device being connected to the interface unit 160, can perform an appropriate control related to the connected external device.

In addition, the memory 170 stores data that supports various functions of the mobile terminal 10. The memory 170 may store a plurality of application programs or applications, which is executed in the mobile terminal, and data, commands for operation of the mobile terminal 10. At least some of these application programs may be downloaded from an external server through a wireless communication. In addition, at least some of these application programs may be on the mobile terminal 10 at the release time for the basic functions (for example, incoming call, outgoing call, incoming message, outgoing message) of the mobile terminal 10. Meanwhile, the application programs may be stored in the memory 170, may be installed on the mobile terminal 10, and may be executed to perform an operation (or function) of the mobile terminal by the controller 180.

The controller 180 can typically control overall operations of the mobile terminal 10 in addition to the operation associated with the application program. The controller 180 can provide or process appropriate information or function to the user by processing input or output signal, data, information, or by executing the application program stored in the memory 170 through the components described above.

The controller 180 can control at least some of the components of FIG. 1 in order to execute the application program stored in the memory 170. Further, the controller 180 can operate in combination with at least two of the components included in the mobile terminal 10 for executing of the application program.

The power supply unit 190 may receive an external power and an internal power and supply the power to each of the components included in the mobile terminal 10 under the control of the controller 180. The power supply unit 190 may include a battery, which may be an internal battery or a replaceable battery.

At least some of the components may operate in cooperation with each other in order to implement operation, control, or control method of the mobile terminal according to various embodiments described below. In addition, the operation, the control, or the control method of the mobile terminal may be implemented on the mobile terminal by the executing of the at least one application program stored in the memory 170.

Referring to FIGS. 2 and 3, the mobile terminal 10 is provided with a bar type of terminal body according to an embodiment. However, the present invention is not limited thereto. The present invention may be applied to various structures such as watch-type, clip-type, glass-type or folder-type, flip-type, slide-type, swing-type, swivel-type in which two or more bodies are coupled so as to be movable relatively. Things associated with a particular type of a mobile terminal or a description of a particular type of a mobile terminal may generally be applied to other types of mobile terminals.

The mobile terminal 10 includes a case forming an external appearance (for example, a frame, a housing, a cover, etc.). As shown, the mobile terminal 10 may include a front case 101 and a rear case 102. Various electronic components are arranged in an inside space formed by the combination of the front case 101 and the rear case 102. At least one middle case may be additionally arranged between the front case 101 and the rear case 102.

The display unit 151 is arranged in a front surface of the terminal body and output information. As shown, a window 151a of the display unit 151 is mounted to the front case 101 and can form the front of the terminal body with the front case 101.

In some cases, an electronic component may be mounted to the rear case. Electronic components such as a detachable battery, an identification module, and a memory card, etc. may be mounted to the rear case 102. In this instance, the rear cover 103 for covering the mounted electronic components may be detachably coupled to the rear case 102. Therefore, when the rear cover 103 is detached from the rear case 102, an electronic component mounted on the rear case 102 is exposed to the outside.

As shown, when the rear cover 103 is coupled to the rear case 102, a side part of the rear case 102 may be exposed. In some cases, when the coupling, the rear case 102 may be completely covered by the rear cover 103. Meanwhile, the rear cover 103 may be provided with an opening for exposing a camera 121b, or an audio output unit 152b to the outside. These cases 101, 102 and 103 may be formed by injection molding of synthetic resin or metal, such as stainless steel (STS), aluminum (Al), titanium (Ti) and the like.

The mobile terminal 10 may be configured, unlike the above example in which a plurality of cases arrange an inner space for accommodating various electronic components, by one case so as to arrange the inner space. In this instance, the mobile terminal 10 having a uni-body in which synthetic resin or metal is leaded to the rear from the side can be implemented.

Meanwhile, the mobile terminal 10 may be provided with a waterproof portion to prevent water from seeping into the terminal body. For example, the waterproof portion is provided between the window 151a and the front case 101, between the front case 101 and the rear case 102, or between the rear case 102 and the rear cover 103, and at a time of a combination thereof, may include a waterproof member for sealing the inner space.

The mobile terminal 10 may include the display unit 151, a first and a second audio output unit 152a, 152b, the proximity sensor 141, the illumination sensor 142, the optical output unit 154, a first and a second cameras 121a, 121b, a first to a third manipulation units 123a, 123b, 123c, the microphone 122, the interface unit 160, and an earphone jack 130.

Hereinafter, as shown in FIGS. 2 and 3, on a front of the terminal body are disposed the display unit 151, the first audio output unit 152a, the proximity sensor 141, the illumination sensor 142, the optical output unit 154, the first camera 121a, and the first manipulation unit 123a. On a side of the terminal body are disposed the second manipulation unit 123b, the microphone 122, the earphone jack 130, and the interface unit 160. On a rear of the terminal body are disposed the second audio output unit 152b, the third manipulation unit 123c, and the second camera 121b. The mobile terminal 10, which includes the front of the terminal body, the side of the terminal body, and the rear of the terminal body may be described as an example.

However, these configurations are not limited to this arrangement. These configurations can be excluded or replaced, or disposed on the other side as needed. For example, the front of the terminal body may not be provided with the first manipulation unit 123a, and the second audio output unit 152b may be provided on the side of the terminal body than the rear of the terminal body.

The display unit 151 can display information processed in the mobile terminal 10. For example, the display unit 151 can display execution screen information of the application program executed on the mobile terminal 10, or UI (User Interface) information, GUI (Graphic User Interface) information according to the execution screen information.

The display unit 151 may include at least one of a liquid crystal display (LCD), a thin film transistor-liquid crystal display (TFT LCD), an organic light-emitting diode (OLED), a flexible display, and a 3D display, an e-ink display.

Further, the display unit 151 can be two or more depending on the implementation of the mobile terminal 10. In this instance, a plurality of display units are spaced apart on one surface or may be disposed integrally, may also be disposed on different surfaces respectively in the mobile terminal 10.

The display unit 151 may include a touch sensor for sensing a touch on the display unit 151 to receive a control command by a touch manner. In this example, when a touch is made to the display unit 151, and the touch sensor senses the touch, the controller 180 can generate a control command corresponding to the touch. Information that is input by a touch may be either a letter or a number, and it may be a specified or indicated menu item in the various modes.

Meanwhile, the touch sensor may be configured as a film type having a touch pattern, and may be arranged between the window 151a and a display on a back surface of the window 151a, or may be a metal wire patterned directly on the back surface of the window 151a. Alternatively, the touch sensor may be formed integrally with the display. For example, the touch sensor may be disposed on a substrate of the display, or may be provided in an interior of the display.

Like this, the display unit 151 may form a touch screen with the touch sensor. In this instance, the touch screen may function as the user input 123 (see FIG. 1). In some instances, the touch screen may replace at least some functions of the first manipulation unit 123a.

The first audio output unit 152a may be implemented as a receiver for transmitting the other party's voice to an ear of the user. The second audio output unit 152b may be implemented as a form of a loud speaker for outputting various kinds of alarm sounds or playing sounds for multimedia.

The window 151a of the display unit 151 may form a sound hole for the release of a sound generated from the first audio output unit 152a. However, the present invention is not limited to this. The sound may be configured to be released along an assembly gap between structures (for example, a gap between the window 151a and the front case 101). In this instance, since holes formed independently for sound output are apparently invisible or hidden, the external appearance of the mobile terminal 10 can become much simpler.

The optical output unit 154 is made to output a light to inform a fact that an event occurs. The event may include examples such as a message reception, a call signal reception, a missed call, an alarm, event notification, e-mail reception, or information reception via an application. If the user's confirmation of the event is detected, the controller 180 can control the optical output unit 154 so that the output of the light ends.

The first camera 121a processes image frames of still images or video obtained by an image sensor in scene mode or video calling mode. The processed image frames can be displayed on the display unit 151, and may be stored in the memory 170.

The first to third manipulation units 123a, 123b, 123c are an example of the user input unit 123, which is operated to receive commands for controlling the operation of the mobile terminal 10, and may be collectively referred to as a manipulating portion. The first to third manipulation units 123a, 123b, and 123c touch, push, scroll, etc. as a tactile manner that is operated while the user is receiving a tactile feel. Further, the first and second manipulation units 123a, 123b may also be adopted in such a way that is operated without the tactile feel of the user through proximity touch and hovering touch, etc. The third manipulation unit 123c may obtain the user's fingerprint with a fingerprint sensor. The obtained fingerprint information may be provided to the controller 180.

In FIG. 2, the first manipulation unit 123a is a touch key as an example, but the present invention is not limited to this. For example, the first manipulation unit 123a can be a mechanical key, or be composed of a combination of the touch key and the mechanical key.

The information that is input by the first and second manipulation units 123a, 123b can be variously set. For example, the first manipulation unit 123a can receive commands on menu, home key, cancel, search, etc., and the second manipulation unit 123b can receive input commands, such as adjusting a volume level of sound output from the first or the second audio output unit 152a, 152b, and switching to a touch recognition mode of the display unit 151.

Meanwhile, the rear surface of the terminal body may be provided with the third manipulation unit 123c as another example of the user input unit 123. The third manipulation unit 123c is to be manipulated in order to receive a command for controlling an operation of the mobile terminal 10, and information to be input may be variously set. For example, the third manipulation unit 123c may receive input commands, such as on/off of the power supply, start, end, scroll, etc., adjusting volume level of sound output from the first or the second audio output unit 152a, 152b, switching to a touch recognition mode of the display unit 151, and acquisition of fingerprint information. A rear input unit may be implemented in the form of a touch input and a push input, or in the form of a combination thereof.

The rear input unit may be disposed to be overlapped with the display unit 151 of the front surface in a thickness direction of the terminal body. For example, the rear input unit may be disposed on the rear upper end of the terminal body to be easily manipulated using an index finger when the user squeezes the terminal body with one hand. However, the present invention is not limited to this, and the location of the rear input unit can be changed.

When the rear input unit is provided on the rear surface of the terminal body, a newer type of user interface is implemented. In addition, in case the first manipulation unit 123a is not disposed on the front surface of the terminal body by replacing at least some functions of the first manipulation unit 123a which is provided on the front surface of the terminal body with the previously described touch screen or the rear input unit, the display unit 151 may be configured in a more large screen.

Meanwhile, the mobile terminal 10 may be provided with a fingerprint recognition sensor to recognize fingerprints of the user, and the controller 180 can use the fingerprint information detected by the fingerprint recognition sensor as an authentication means. The fingerprint recognition sensor may be embedded in the display unit 151 or the user input unit 123.

Further, the microphone 122 may input a user's voice, other sounds and so on. The microphone 122 may be provided in a plurality of locations and may be configured to input stereo sound.

The interface unit 160 can connect the mobile terminal 10 to an external device. For example, the interface unit 160 may be at least one of connection terminals for connection to another device (for example, an earphone, an external speaker), ports for short-range communication (for example, an infrared port (IrDA Port), a Bluetooth port, a wireless LAN Port, etc.), or power supply terminals for supplying power to the mobile terminal 10. The interface unit 160 may be implemented in the form of a socket for accommodating SIM (Subscriber Identification Module) or UIM (User Identity Module), or an external card such as a memory card for information storage.

The second camera 121b may be disposed on the rear surface of the terminal body. In this instance, the second camera 121b may have a photographing direction that is substantially opposite to the first camera 121a.

The second camera 121b may include a plurality of lenses that are arranged along at least one line. The plurality of lenses may be arranged in matrix format. These cameras may be referred to as "array camera." If the second camera 121b is configured by an array camera, it is possible to take images in a variety of ways using the plurality of lenses, and to obtain a better quality image.

A flash 124 may be disposed adjacent to the second camera 121b. The flash 124 may illuminate light toward a subject when the second camera 121b is for shooting the subject. The second audio output unit 152b may be disposed in addition to the terminal body. The second audio output unit 152b may implement a stereo function together with the first audio output unit 152a, and may be used for the implementation of a speakerphone mode during a call.

The terminal body may be provided with at least one antenna for a wireless communication. The antenna may be embedded in the terminal body or may be formed in the case. For example, an antenna that is part of a broadcast receiving module 111, see FIG. 1, may be configured to be drawn out from the terminal body. Alternatively, the antenna may be formed in a film type and may be attached to an inner surface of the rear cover 103. A case comprising a conductive material may be configured to function as an antenna.

The terminal body is provided with a power supply unit 190, see FIG. 1, for supplying power to the mobile terminal 10. The power supply unit 190 may be embedded in the terminal body or may include a battery 191 that can be detachable in the outside of the terminal body.

The battery 191 may be configured to supply power through a power cable connected to the interface unit 160. Further, the battery 191 may be configured to enable wireless charging via a wireless charger. The wireless charging may be implemented by magnetic induction or resonance scheme (magnetic resonance scheme).

Meanwhile, the drawing exemplifies the rear cover 103 is coupled to the rear case 102 to cover the battery 191 and limits separation of the battery 191, and is configured to protect the battery 191 from an external impact and foreign objects. When the battery 191 is detachably configured on the terminal body, the rear cover 103 may be detachably coupled to the rear case 102.

An accessory to protect an appearance of the mobile terminal 10 or to assist or extend a function of the mobile terminal 10 may be added to the mobile terminal 10. An example of the accessory may be a cover to cover at least one surface of the mobile terminal 10 or a pouch to accommodate at least one surface of the mobile terminal 10. The cover or the pouch may be configured to extend the function of the mobile terminal 10 by interacting with the display unit 151. Another example of the accessory may be a touch pen to assist or extend a touch input on the touch screen.

Figure 4:
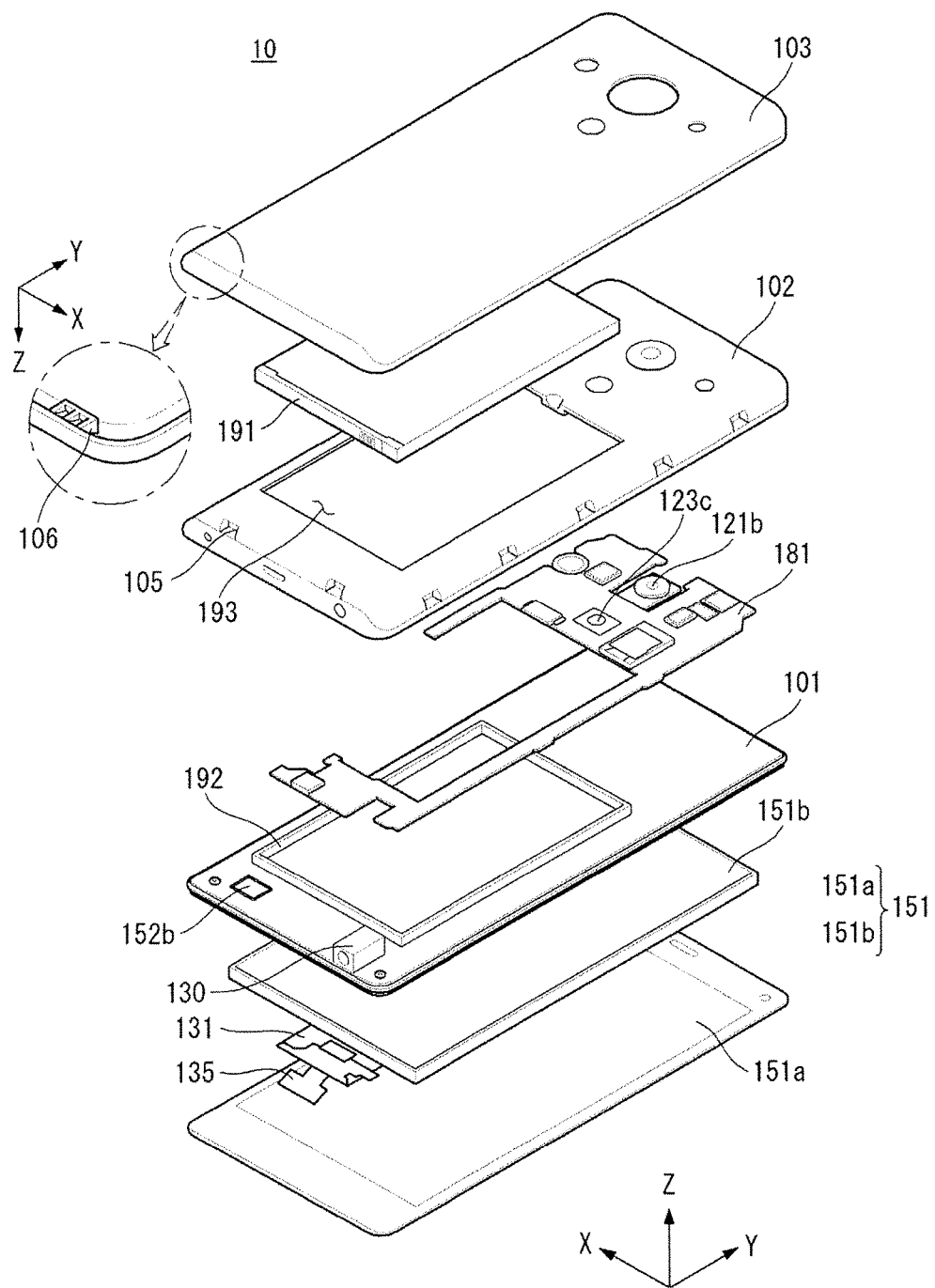
FIG. 4 is an exploded perspective view of the mobile terminal of FIG. 2.

FIG. 4 is an exploded perspective view of the mobile terminal of FIG. 2. As shown in FIG. 4, a display unit 151 may include a window 151a and a display panel 151b. The display panel 151b may include a touch sensor on one side.

A touch circuit board 135 and a display circuit board 131 may be formed on one side of the display panel 151b. The display circuit board 131 may be formed at the bottom of the display panel 151b, and may be connected to a main circuit board 181. The touch circuit board 135 may be connected to the main circuit board 181 and may provide a signal related to the obtained touch input.

The display unit 151 may be accommodated in the front case 101. A battery containing part 192 may be formed on a rear surface of the front case 101. The battery containing part 192 may be formed to protrude from the rear surface of the front case 101 and can accommodate the battery 191.

The front case 101 may be fastened to the rear case 102. A hole 193 may be formed on one side of the rear case 102. The hole 193 formed in the rear case 102 can mount the battery 191 to the battery containing part 192.

Electronic components may be disposed between the front case 101 and the rear case 102. For example, the battery 191, the main circuit board 181, the audio output unit 152b, and the earphone jack 130 may be disposed on the rear surface of the front case 101. The third manipulation unit 123c that can obtain the fingerprint information may be connected to the main circuit board 181.

The front case 101 may be a plate shape the front surface of which is filled, and may be a plate shape which is partly formed with an empty space. For example, the front case 101 shown in FIG. 4 may be a plate shape and the front surface of which is filled.

The rear cover 103 may be connected to the rear surface of the rear case 102 as shown in FIG. 4. The rear cover 103 may include a coupling protrusion 106 as shown in FIG. 4. The coupling protrusion 106 may be formed along a rim of the rear cover 103. The coupling protrusion 106 may be formed in plural number. The coupling protrusion 106 may be formed inside of the rear cover 103. The rear case 102, as shown in FIG. 4, may include a coupling groove 105. The coupling groove 105 may be formed on the back surface of the rear case 102. The coupling groove 105 may be formed corresponding to the coupling protrusion 106. The coupling protrusion 106 may be combined with the coupling groove 105 by being inserted into one end of the coupling groove 105. The coupling groove 105 and the coupling protrusion 106 may provide a binding force for the rear case 102 and the rear cover 103. For binding and separation of the coupling groove 105 and the coupling protrusion 106, the rear cover 103 may have an elastic force.

The rear cover 103 is detachable from the rear surface of the rear case 102. When the rear cover 103 is attached to the rear surface of the rear case 102, an external appearance of the rear surface or the back surface of the mobile terminal 10 can be formed. When the rear cover 103 is detached from the rear surface of the rear case 102, the battery 191 may be exposed to the outside. When the battery 191 is exposed to the outside, it may be possible to replace the battery 191.

The rear cover 103 may form an opening. At least a portion of the camera 121b and at least a portion of the third manipulation unit 123c may be exposed to the outside through the opening formed on the rear cover 103.

Figure 5:
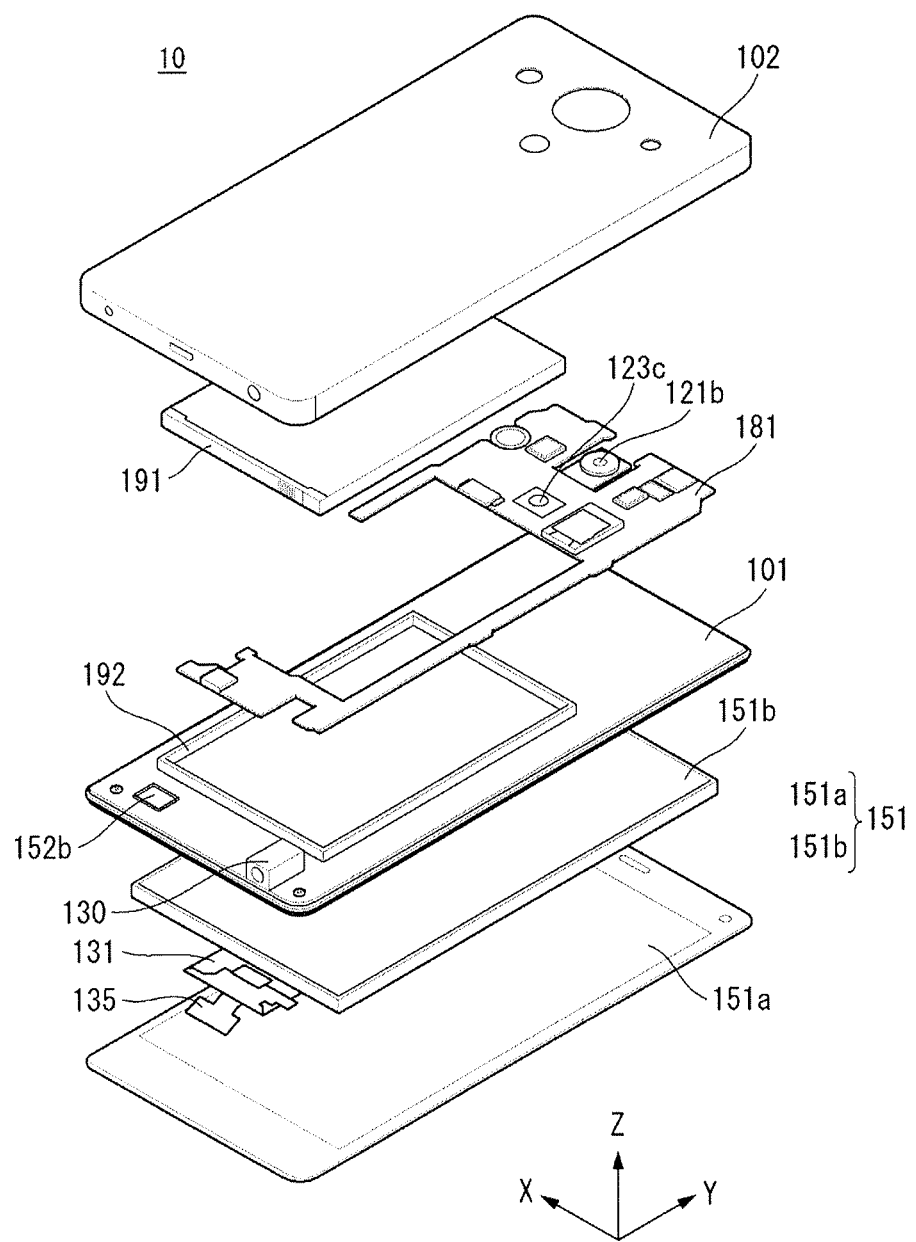
FIG. 5 is an exploded perspective view showing another embodiment of a mobile terminal related to the present invention.

FIG. 5 is an exploded perspective view showing another embodiment of a mobile terminal related to the present invention. A mobile terminal 10 shown in FIG. 5 may be different from the mobile terminal 10 shown in FIG. 4 in that a rear case 102 can be formed integrally with the rear cover 103, see FIG. 4. When the rear case 102 is formed integrally with the rear cover 103, see FIG. 4, at least a portion of the rear case 102 can easily be configured with metal. When the rear case 102 is formed integrally with the rear cover 103, see FIG. 4, it may be advantageous in ensuring rigidity of the rear case 102.

A front case 101 can be fastened to the rear case 102. Electronic components may be disposed between the front case 101 and the rear case 102. When the front case 101 is fastened to the rear case 102, the electronic components located inside of the mobile terminal 10 may not be exposed to the outside. A battery 191, a main circuit board 181, an audio output unit 152b, and an earphone jack 130 may be disposed on a rear surface of the front case 101. A main circuit board 181 may be connected to a third manipulation unit 123c that can obtain fingerprint information.

The rear case 102 may provide a space in which the electronic components are mounted. The rear case 102 can be formed as at least a portion of the rear surface of the mobile terminal 10. The rear case 102 can be formed as at least a portion of the side surface of the mobile terminal 10.

A display unit 151 may include a window 151a and a display panel 151b. A touch circuit board 135 and a display circuit board 131 may be connected to the display panel 151b. The display unit 151 can be accommodated in the front case 101. The touch circuit board 135 and the display circuit board 131 may be connected to the main circuit board 181. A battery containing part 192 can accommodate the battery 191 by being formed on the rear surface of the front case 101.

Figure 6:
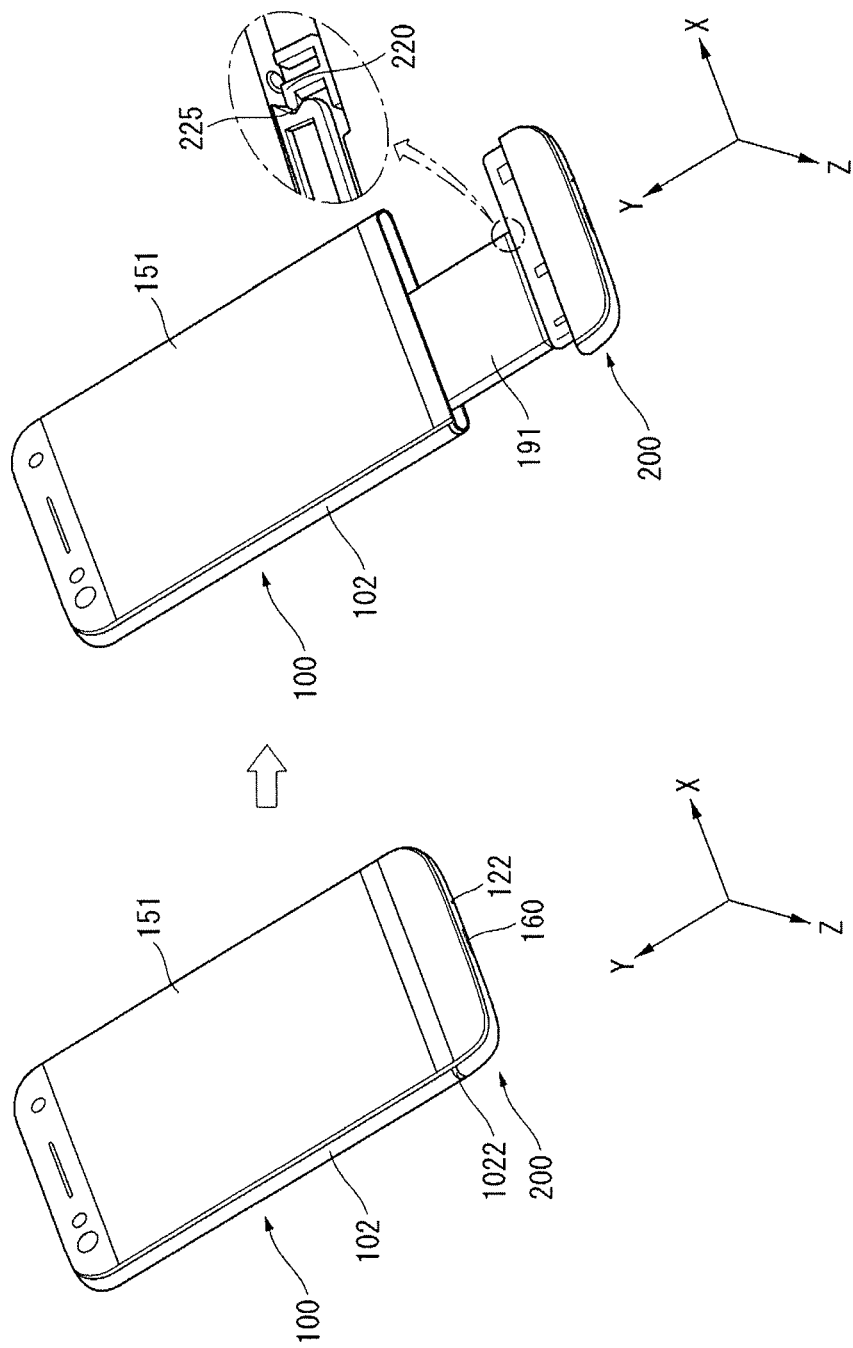
FIGS. 6 and 7 are conceptual diagrams showing in different directions the other embodiment of a mobile terminal related to the present invention.
Figure 7:
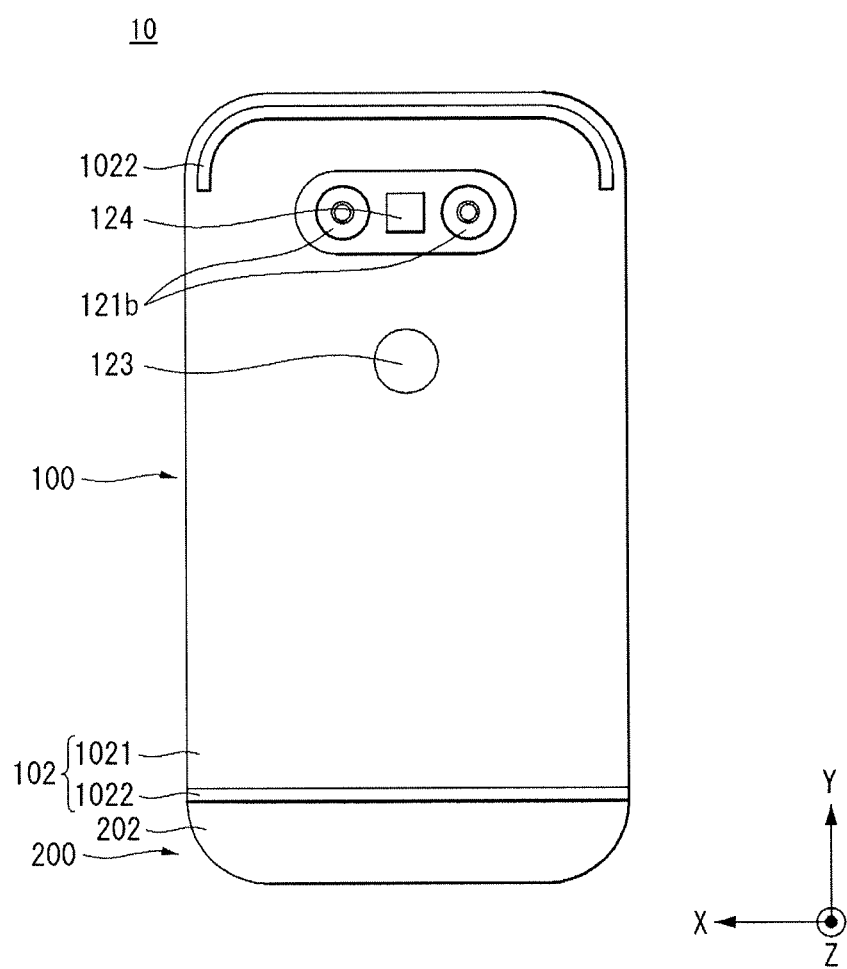

FIGS. 6 and 7 are conceptual diagrams showing in different directions another embodiment of a mobile terminal related to the present invention.

The display unit 151, the first audio output unit 152a, the proximity sensor 141, the illumination sensor 142, the first and second cameras 121a, 121b, the user input unit 123, the microphone 122, the interface unit 160, and the flash 124 provided in the mobile terminal 10, and the like, are as described above.

The mobile terminal 10 may include a first body 100 and a second body 200. The second body 200 may be separated from the first body 100 in a state in which the second body 200 is coupled to the first body 100 as shown in FIG. 6. Alternatively, the second body 200 may be coupled to the first body 100 in a state in which the second body 200 is separated from the first body 100. The second body 200 may be coupled to the first body 100 by using a hook. The first body 100 and second body 200 may include hooks corresponding to each other.

The second body 200 may include a fixing protrusion 220. The fixing protrusion 220 can be combined with or separated from the battery 191. The battery 191 may include a fixing groove 225. The fixing groove 225 may be formed on one side of the battery 191. The battery 191 can be combined with or separated from the second body 200 when the fixing groove 225 is combined with or separated from fixing protrusion 220. The fixing protrusion 220 may be provided with an elastic force (or a restoring force).

The battery 191 provided to the mobile terminal 10 may be connected to one side of the second body 200, as shown in FIG. 6. The battery 191 connected to the second body 200 may be separated from the second body 200. In other words, the battery 191 can be changed due to the structure of the first body 100 and the second body 200 for separation and coupling.

The first body 100 may include the rear case 102 for covering the side surface and the rear surface of the first body 100. The display unit 151 may be located in the front surface of the rear case 102. The configuration that the side surface and the rear surface of the first body 100 are integrally formed may be effective to reduce thickness of the mobile terminal 10. At least a portion of the rear case 102 may be made of metal. In a situation in which the rear case 102 is made of metal, when the radio wave does not pass in and out of the rear case easily, the antenna may not work well.

The rear case 102 may include a metal portion 1021 made of metal and a resin portion 1022 made of non-conductive materials. The resin portion 1022 may have a non-conductive nature. The resin portion 1022 may be dielectric. An antenna provided in the mobile terminal 10 may be located adjacent to the resin portion 1022. Radio waves for transmitting and receiving from an antenna provided in the mobile terminal 10 can pass through the resin portion 1022.

The metal portion 1021 may be formed through casting or press working. The resin portion 1022 may be formed by injection molding on the metal portion 1021. The resin portion 1022 may be a plastic as polymer material. The resin portion 1022 may be coupled to the metal portion 1021.

A lower end of the first body 100 may be connected to an upper end of the second body 200. The resin portion 1022 may be located at the lower end of the first body 100. The resin portion 1022 may be formed as plural numbers. The resin portion 1022 may be located on an upper end of the first body 100.

The second body 200, as shown in FIG. 7, may include a second rear case 202 which covers the rear surface of the second body 200. The second rear case 202 may cover the side surface and the back surface of the second body 200. The second rear case 202 may provide a space to which electronic components are mounted.

Figure 8:
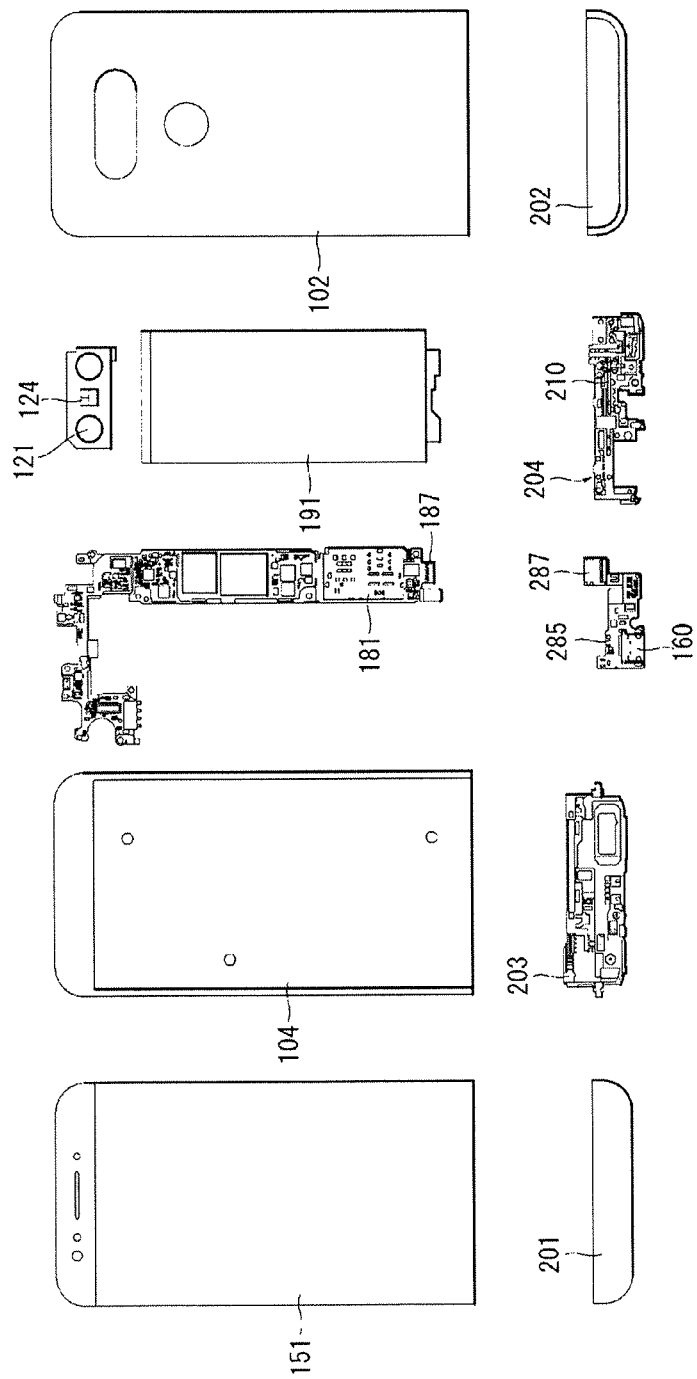
FIG. 8 is an exploded view of the mobile terminal shown in FIGS. 6 and 7.

FIG. 8 is an exploded view of the mobile terminal shown in FIGS. 6 and 7. The first body 100 may include the display unit 151, a middle frame 104 for supporting a back surface of the display unit 151, a main circuit board 181 mounted on the back surface of the middle frame 104, a first connector 187 connected to the main circuit board 181, and the rear case 102 for covering the rear surface of the main circuit board 181. The main circuit board 181 may be connected to the camera 121 and the flash 124. The camera 121 and the flash 124 may be fixed to a bracket.

The display unit 151 may be mounted on the front surface of the middle frame 104. The camera 121, an audio output unit 152a (referring FIG. 2), and the proximity sensor 141 (referring FIG. 2) and the like may be located on the upper side of the display unit 151.

The second body 200 may include a second front case 201 and the second rear case 202. The second front case 201 and the second rear case 202 may be combined to form a space therein. At least one of the second front case 201 and the second rear case 202 may include metallic materials.

The second body 200 may include an inside housing 203, an auxiliary circuit board 285, and a second inside housing 204.

The inside housing 203 may be located between the second front case 201 and the second rear case 202. The inside housing 203 may be combined with the first body 100. The inside housing 203 may be combined with the battery 191.

The auxiliary circuit board 285 may be connected to one side of the inside housing 203. The auxiliary circuit board 285 may be connected to a second connector 287 and the interface unit 160, and transmit and receive an electrical signal. The auxiliary circuit board 285 can carry out at least some of the functions of the controller 180 shown in FIG. 1.

The second connector 287 may be electrically connected to the first connector 187 when the second body 200 is coupled to the first body 100. The second connector 287 provides an electrical path connecting the second body 200 and the first body 100 by being connected to the first connector 187.

The interface unit 160 may be connected to the auxiliary circuit board 285. The electrical signals that are transmitted and received through the interface unit 160 may sequentially reach the auxiliary circuit board 285, the second connector 287, the first connector 187, and the main circuit board 181, or in the reverse order.

The second inside housing 204 may be located between the second front case 201 and the second rear case 202. The second inside housing 204 may include an antenna pattern 210. The antenna pattern 210 may be formed on an outer side of the second inside housing 204. The antenna pattern 210 can function as an antenna. The antenna pattern 210 can receive and transmit radio waves. The antenna pattern 210 may be adjacent to the resin portion 1022 when the second body 200 is coupled to the first body 100. Radio waves transmitted and received by the antenna pattern 210 can pass through the resin portion 1022 when the second body 200 is coupled to the first body 100.

The antenna pattern 210 may be connected to the second rear case 202 when the second rear case 202 includes a metal material. The second rear case 202 containing the metal material is connected to the antenna pattern 210 and can receive and transmit radio waves.

Figure 9:
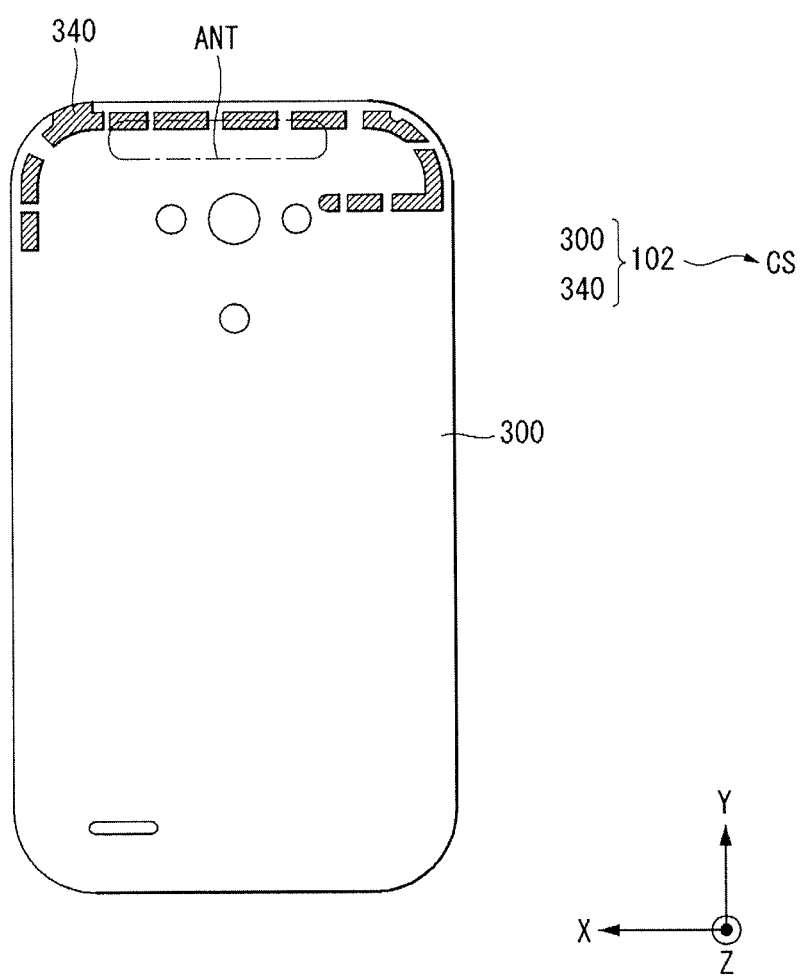
FIGS. 9 and 10 are diagrams showing a rear case of a mobile terminal according to an embodiment of the present invention.
Figure 10:
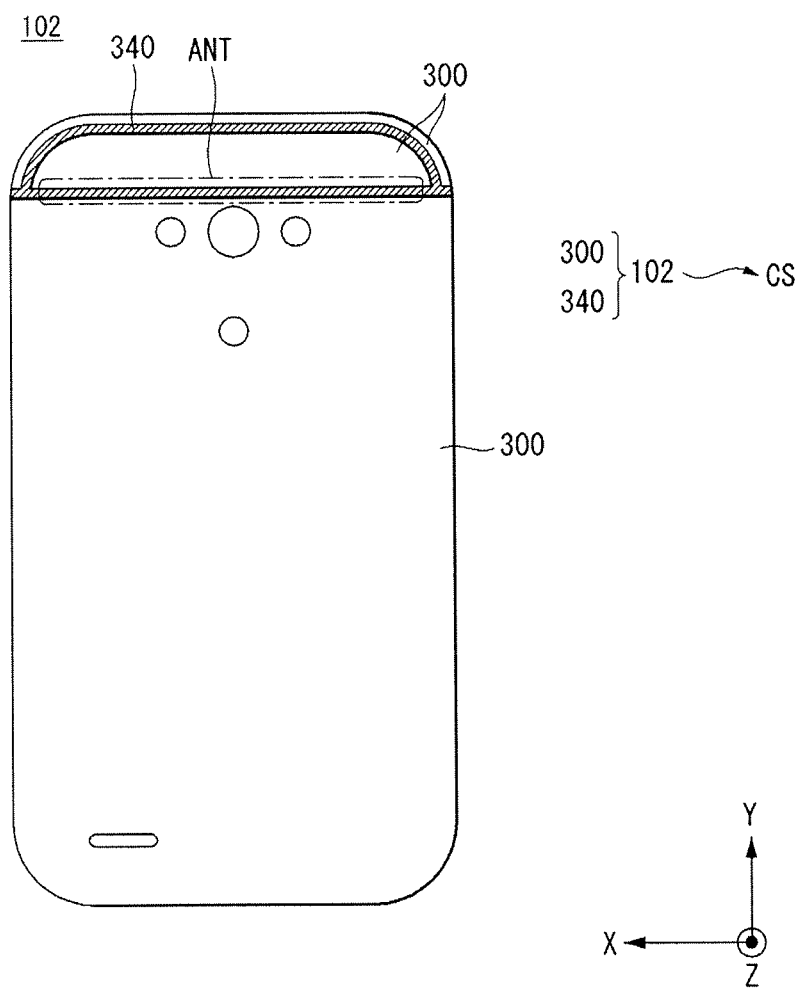

FIGS. 9 and 10 are diagrams showing a rear case of a mobile terminal according to an embodiment of the present invention. The rear case 102 shown in FIG. 9 may refer to the rear case 102 shown in FIGS. 2 to 8. The rear case 102 according to an embodiment of the present invention may form at least a portion of a case CS forming an appearance of the mobile terminal 10 according to an embodiment of the present invention.

The rear case 102 may cover the side surface and the back surface of the mobile terminal 10. At least a portion of the rear case 102 may be made of metal. The rear case 102 may include a conductive cover 300 and a dielectric member 340.

At least a portion of the conductive cover 300 may be made of metal. The conductive cover 300 may be formed in casting or press working. The conductive cover 300 may cover at least a portion of the back surface of the mobile terminal 10 and at least a portion of the side surface of the mobile terminal 10. The conductive cover 300 may include an opening. The opening may be provided in plural number. The opening may be formed on one side of the conductive cover 300. At least a portion of the opening may be a shape wrapped with the conductive cover 300. An earphone jack or a headset jack may be located in the opening 301. The earphone jack or the headset jack can output an audio signal.

The dielectric member 340 may be located adjacent to the conductive cover 300. The dielectric member 340 may be coupled to one side of the conductive cover 300. The dielectric member 340 may be located in an opening formed on the conductive cover 300. The dielectric member 340 may fill at least one opening of the openings formed on the conductive cover 300. FIGS. 9 and 10 may represent a shape that the dielectric member 340 positions in the openings formed with different shapes. The opening in FIG. 10 may be a shape of a slit or a gap.

The dielectric member 340 may be a non-conductive. The dielectric member 340 can be transmitted by a radio wave. The dielectric member 340 may be formed by injection molding. An earphone jack or a headset jack may be disposed in the dielectric member 340. The dielectric member 340 may fix (or support) the earphone jack or the headset jack.

The dielectric member 340 may include a polymer material. The dielectric member 340 may include a plastic. The dielectric member 340 may include glass fibers. The glass fibers may be effective in enhancing the rigidity of the dielectric member 340.

The antenna ANT may be adjacent to the dielectric member 340 and may be located in the interior of the mobile terminal 10. In FIGS. 9 and 10, the antenna ANT may be shown by one-dot chain line. Radio waves (or electromagnetic waves) transmitted and received by the antenna ANT can pass through the dielectric member 340. The antenna ANT may be located to be in contact with or adjacent to the interior surface of the case CS.

Figure 11:
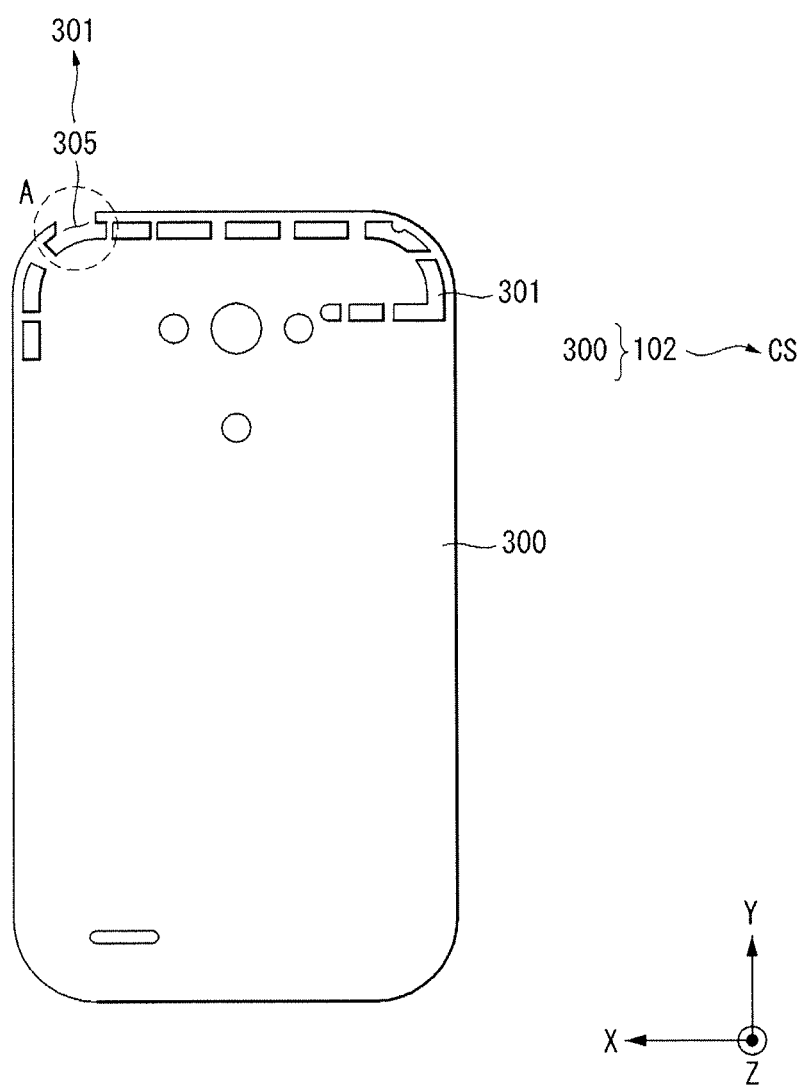
FIG. 11 is a diagram showing a conductive cover in the rear case shown in FIG. 9.

FIG. 11 is a diagram showing a conductive cover in the rear case shown in FIG. 9. FIG. 11 is a diagram showing only the conductive cover 300 except for the dielectric member 340 in the rear case 102 shown in FIG. 9.

The conductive cover 300, as described above, may include the opening 301 (e.g., a gap). The opening 301 may be formed on one side of the conductive cover 300. The opening 301 may be in a shape of a slit 305. The opening 301 may be adjacent to a rim along the rim of the conductive cover 300 (e.g., the opening or gap may be disposed in an edge of the mobile terminal).

Figure 12:
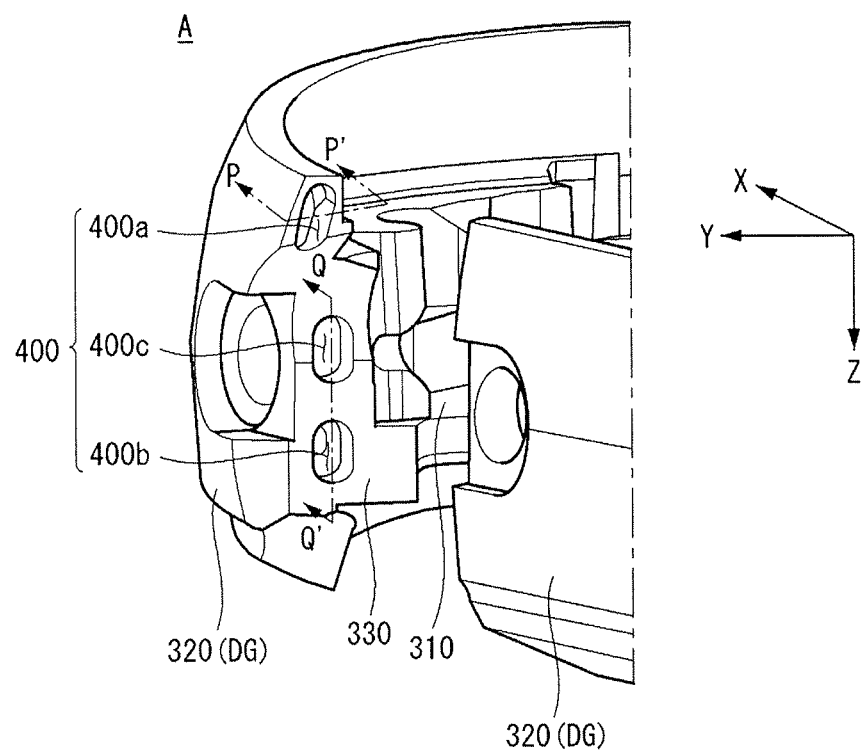
FIG. 12 is a diagram showing an area A of FIG. 11.

FIG. 12 is a diagram showing an area A of FIG. 11. As shown in FIG. 12, the conductive cover 300 may include an interior surface 310 (e.g., an inside or inner back surface), an exterior surface 320 (e.g., a portion exposed to the outside of the mobile terminal, such as an outer edge of the mobile terminal), and a thickness surface 330 (e.g., a lateral surface). The interior surface 310 may be a surface facing an inside of the mobile terminal 10. The exterior surface 320 may be a surface facing an outside of the mobile terminal 10. The thickness surface 330 may be a lateral surface or a side surface which is extended toward the exterior surface 320 from an end portion of the interior surface 310. The thickness surface 330 or lateral surface 330 shown in FIG. 12 may maybe include the thickness surface or lateral surface 330 of the opening 301 or the slit 305.

Figure 13:
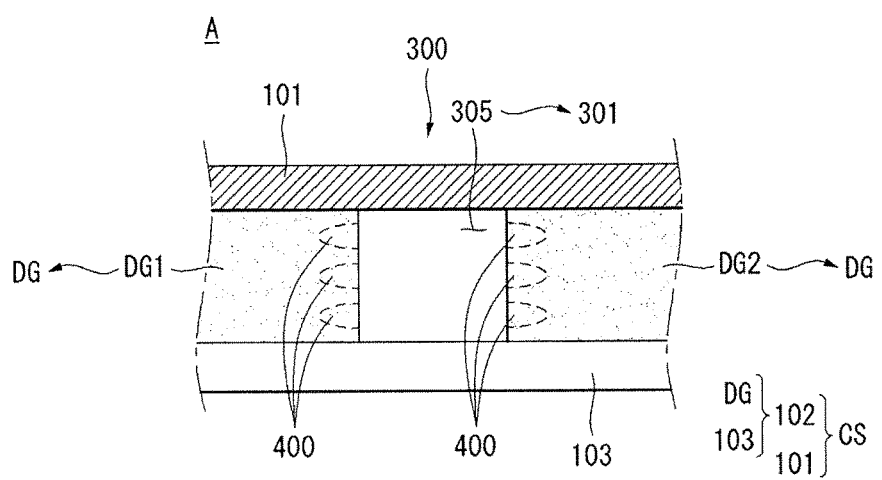
FIG. 13 is a diagram schematically showing the area A of FIG. 11 with a front case.
Figure 14:
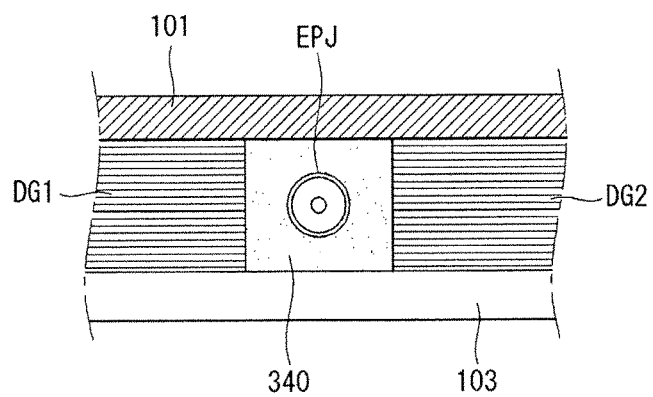
FIG. 14 is a diagram showing an earphone jack and a dielectric member disposed in the opening in FIG. 13.
Figure 15:
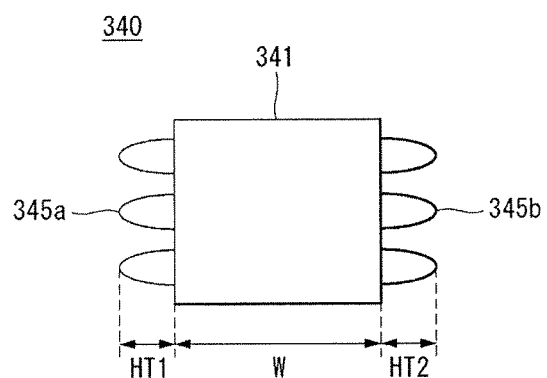
FIGS. 15 to 17 are diagrams showing the dielectric member filled in the slit and the cavity of FIG. 13.

A cavity 400 may be formed on the thickness surface 330 (e.g., lateral surface on either side of a gap in the conductive cover) of the conductive cover 300. The cavity 400 may refer to a space formed toward an inside of the conductive cover 300 in the thickness surface 330 (e.g., into a lateral surface 300) of the conductive cover 300. The cavity 400 may be formed on a contact surface between the conductive cover 300 and the dielectric member 340. The contact surface between the conductive cover 300 and the dielectric member 340 may be the thickness surface 330 (e.g., a lateral side surface) of the conductive cover 300 inside the opening 301. For example, the case can include a conductive member having a first section with a first lateral surface and a second section with a second lateral surface, in which a gap 305 is located between first and second lateral surfaces, and one or more cavities can extend into the first lateral surface and/or the second lateral surface. Also, the first and second lateral surfaces on either side of the gap/slip 305 can be curved (e.g., FIG. 12) or flat (e.g., FIG. 13). Further in this example, the dielectric member can fill the gap 305 and the one or more cavities 400, in order to create a type of plug. As shown in FIGS. 13-15, the dielectric plug can have one or more pegs (e.g., protrusions) that extend out of the sides of the plug and correspond to the one or more cavities 400.

The cavity 400 may have a length direction. The length direction of the cavity 400 may be a depression direction. The depression direction of the cavity 400 may be a direction toward an inside of the conductive cover 300. The cavity 400 may be formed in plural number. The cavity 400 may be formed in plural number on the thickness surface 330 located at one opening 301. For example, as shown in FIG. 12, a first cavity 400a, a second cavity 400b, and a third cavity 400c may be located on a side located in the one opening 301. The opening 301, as shown in FIG. 12, may be formed on an edge portion DG of the conductive cover 300 (e.g., an outer edge that is exposed to the outside of the mobile terminal). The edge portion DG of the conductive cover 300 may refer to a lateral edge of the conductive cover 300.

The cavity 400 may be formed in plural number with different heights and different shapes. A shape of the cavity 400 may be changed according to a shape (or a structure) of the opening 301 or the slit 305 (e.g., gap) in which the cavity 400 is located. In other words, the shape of the cavity 400 may correspond to the shape of the opening 301 or the slit 305 in which the cavity 400 is located. Here, the shape of the opening 301 or the slit 305 may take a factor, such as a width, a length, a depth of the opening 301 or the slit 305. A depth direction of the opening 301 or the slit 305 may be a direction parallel with a direction toward the exterior surface 320 from the interior surface 310 of the conductive cover 300.

FIG. 13 is a diagram schematically showing the area A of FIG. 11 with a front case 101. FIG. 13 may represent a state as viewed in the depth direction of the opening 301 or the slit 305. The conductive cover 300 may include the edge portion DG which covers the side surface of the mobile terminal 10 and the rear cover 103 which covers the rear surface (or the back surface) of the mobile terminal 10. The edge portion DG and the rear cover 103 may be integrally formed. The conductive cover 300 may be at least a portion of the rear case 102. The rear case 102 and the front case 101 may be included in the case CS of the mobile terminal 10.

The edge portion DG of the conductive cover 300 may be located on both sides of the slit 305 or the opening 301. For example, a first edge portion DG1 and a second edge portion DG2 may be located on both sides of the slit/gap 305. The slit 305 or the opening 301 may be located between the first edge portion DG1 and the second edge portion DG2.

The cavity 400 may be formed on the edge portion DG at a lateral surface of the slit 305 or the opening 301. For example, the cavity 400, formed as a plural number cavities, may be formed on one side of the first edge portion DG1 and one side of the second edge portion DG2 (e.g., cavities can extend into the conductive member of the case in opposite directions). In FIG. 13, the cavity 400 is formed on the first edge portion DG1 and the second edge portion DG2 and may not be apparent (e.g., when viewing from the outside of the mobile terminal). In FIG. 13, the cavity 400 may be shown as a dotted line.

The depression direction or the length direction of the cavity 400 may be substantially perpendicular to the depth direction of the gap/slit 305 or the opening 301 where the cavity 400 is located. That is, the depression direction or the length direction of the cavity 400 may be substantially parallel to a plane (referred to below as the "slit plane" or "opening plane") determined by a width direction and a length direction of the slit 305 or the opening 301 where the cavity 400 is located. The depression direction or the length direction of the cavity 400 may be substantially parallel to a direction in which the case CS is formed or extended.

The depression direction or the length direction of the cavity 400 may be associated with the dielectric member 340 which is filled in the slit 305 or the opening 301. The dielectric member 340 which is filled in the slit 305 or the opening 301 may be vulnerable to a force applied to the dielectric member 340 in a direction perpendicular to the "slit plane" or "opening plane." The cavity 400 may form a strong shape of the dielectric member 340 to an external impact by being formed in a direction substantially parallel to the "slit plane" or "opening plane" in the slit 305 or the opening 301. For example, in FIG. 13, "slit plane" or "opening plane" may be substantially parallel to the XZ plane. The depression direction or the length direction of the cavity 400 may be substantially parallel to the XZ plane.

FIG. 14 is a diagram showing an earphone jack and a dielectric member filled in the opening/gap in FIG. 13. The mobile terminal 10 according to an embodiment of the present invention may include an earphone jack EPJ.

The earphone jack EPJ may output an audio signal. At least a portion of the earphone jack EPJ may be wrapped or surrounded by the dielectric member 340. The earphone jack EPJ may be fixed to or supported by the dielectric member 340.

The dielectric member 340 may fill the opening 301 or the slit/gap 305 shown in FIG. 13. The dielectric member 340 may fill the cavity 400 of FIG. 13. The dielectric member 340 may support an electronic device. For example, the dielectric member 340, as shown in FIG. 14, can support the earphone jack EPJ by surrounding the earphone jack EPJ.

Figure 16:
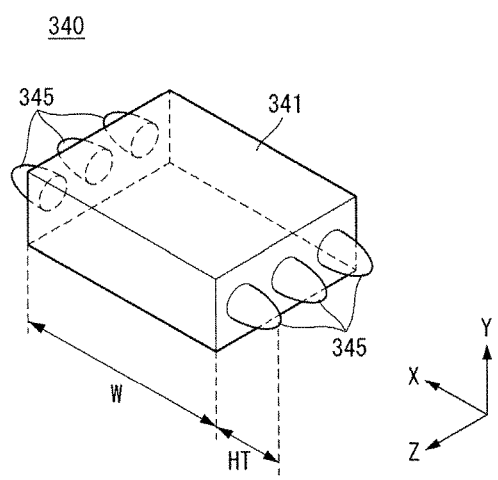
Figure 17:
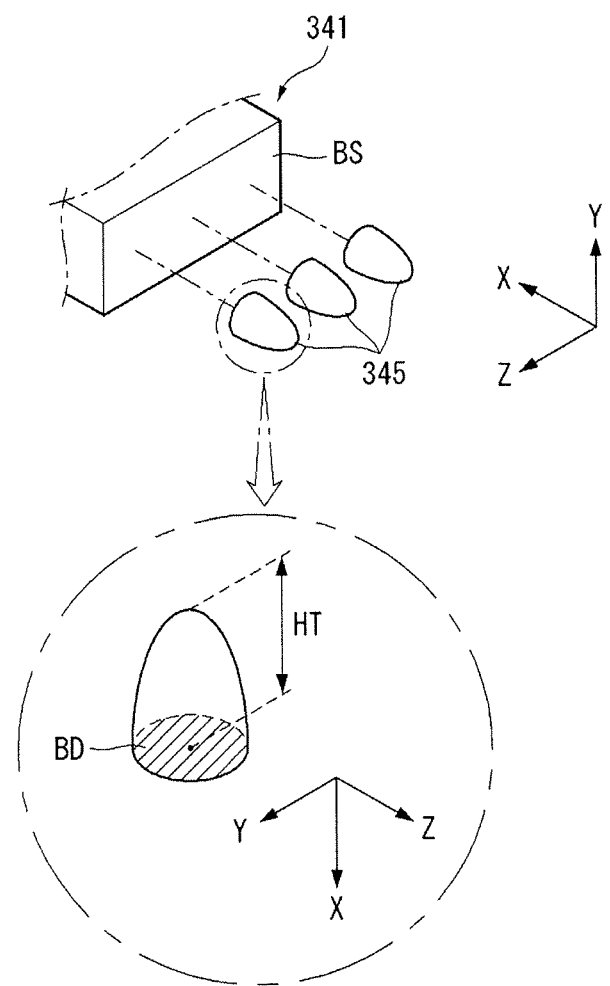

FIGS. 15 to 17 are diagrams showing the dielectric member 340 filled in the slit/gap and the cavity of FIG. 13. FIG. 15 is a diagram showing the dielectric member 340 in a direction substantially perpendicular to "slit plane" or "opening plane."

The dielectric member 340 may fill the slit 305 or the opening 301. A portion of the dielectric member 340 formed by filling the slit 305 or the opening 301 may form a body 341 of the dielectric member 340. The body 341 of the dielectric member 340 may have a width as shown in FIG. 15.

The dielectric member 340 may fill the cavity 400 formed at the slit 305 or the opening 301. A portion of the dielectric member 340 formed by filling the cavity 400 may form a protrusion 345 of the dielectric member 340. The protrusion 345 of the dielectric member 340 may have a shape extended from the body 341 in a width direction of the body 341 of the dielectric member 340. The protrusion 345 of the dielectric member 340 may correspond to the shape of the cavity 400. For example, the dielectric member 340 can form a plug having a rectangular shape with pegs or protrusions extending from either side).

The protrusion 345 of the dielectric member 340 may have a length direction. The length direction of the protrusion 345 may be parallel to the depression direction of the cavity 400. A length in the length direction of the protrusion 345 may be a height extended away from a main body of the dielectric member. For example, a height of a first protrusion 345a formed on one side of the body 341 may be HT1. A height of a second protrusion 345b formed on the other one side of the body 341 may be HT2. A protrusion direction of the first protrusion 345a and the second protrusion 345b may be opposite to each other. The protrusion 345 may be overlapped with the conductive cover 300.

A width of the dielectric member 340 may be a width direction of the body 341. The width of the dielectric member 340 may correspond to the width of the body 341 and the height of the protrusion 345. For example, the width of the dielectric member 340 may be a sum of a width 'W' of the body 341, and heights 'HT1' and 'HT2' of the first and the second protrusion 345a, 345b.

The width of the dielectric member 340 may be associated with durability of the dielectric member 340 with respect to an external impact applied to the dielectric member 340 (e.g., the protrusions 345 can act as teeth that can securely grip into the conductive cover). For example, the larger the width W of the body of the dielectric member 341 is, the weaker to the external impact the dielectric member 340 may be. For example, the larger the height of the protrusion 345 of the dielectric member is, the stronger to the external impact the dielectric member 340 may be.

In FIG. 16, the height of the protrusion 345 formed on one side of the body 341 may be represented by the 'HT'. In case the protrusion 345 is formed in plural on a surface of the body 341, the height of the protrusion 345 may mean at least one of an average height of a plurality of protrusions 345, any one of the height of a plurality of protrusions 345, and the highest height of a plurality of protrusions 345. Further in this example, the protrusions 345 can have a rounded shape, an oval shape or a conical shape.

As shown in FIG. 17, a boundary surface BS may be formed on one side of the body 341. The boundary surface BS may be a surface of which the dielectric member 340 makes contact with the thickness surface 330 (e.g., lateral surfaces on either side of the gap/silt) of the case CS or the thickness surface 330 of the conductive cover 300. The boundary surface BS may have an area. The "boundary surface BS" may mean an area of the boundary surface BS.

As shown in FIG. 17, the protrusion 345 may have a height HT and a bottom dimension BD as a factor or an element. The height HT may refer to a length of the protrusion 345 extended from body 341. The bottom dimension BD may refer to a surface or an area of the surface of which the protrusion 345 makes contact with the body 341. The bottom dimension BD may a portion of the boundary surface BS.

A ratio of the bottom dimension BD to the boundary surface BS may be considered. In the ratio of the bottom dimension BD to the boundary surface BS, the boundary surface BS may refer to the area of the boundary surface BS. The ratio of the bottom dimension BD to the boundary surface BS may be related to durability of the dielectric member 340. The ratio of the bottom dimension BD to the boundary surface BS may be related to degree to which the dielectric member 340 withstands an external impact. Durability of the external impact of the dielectric member 340 may refer to a coupling force with the dielectric member 340.

The larger the bottom dimension BD is, the greater the ratio of the bottom dimension BD to the boundary surface BS is. The larger the boundary surface BS is, the smaller the ratio of the bottom dimension BD to the boundary surface BS is. The greater the ratio of the bottom dimension BD to the boundary surface BS is, the greater the durability of the dielectric member 340 is. The smaller the ratio of the bottom dimension BD to the boundary surface BS is, the more vulnerable to the external impact the dielectric member 340 may be.

A portion of the conductive cover 300 which overlaps the protrusion 345 in an inner and outer direction may be considered. The greater the ratio of the bottom dimension BD to the boundary surface BS is, the larger the portion of the conductive cover 300 which overlaps the protrusion 345 in the inner and outer direction is. The larger the portion of the conductive cover 300 which overlaps the protrusion 345 in the inner and outer direction is, the smaller the durability of the conductive cover 300 is.

The ratio of the bottom dimension BD to the boundary surface BS may affect the durability of the dielectric member 340 and the durability of the conductive cover 300. The durability tendency of the dielectric member 340 for the ratio of the bottom dimension BD to the boundary surface BS may be different from the durability tendency of the conductive cover 300 for the ratio of the bottom dimension BD to the boundary surface BS. In other words, the ratio of the bottom dimension BD to the boundary surface BS may have an optimal value for the durability of the entire of the case CS.

Figure 18:
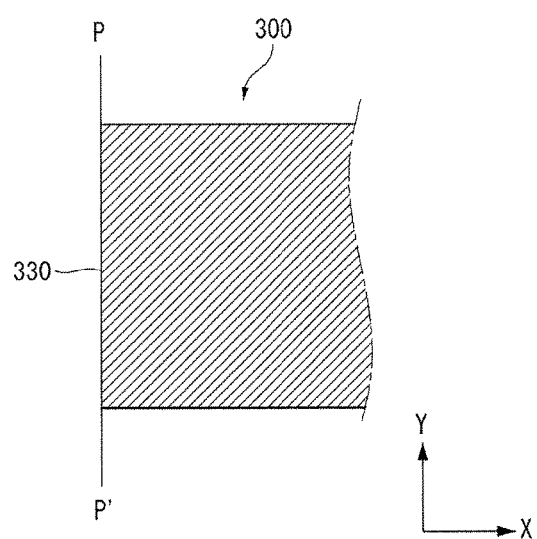
FIGS. 18 to 20 show various embodiments of a cross-section formed by cutting the conductive cover of FIG. 12 along P-P' direction.
Figure 19:
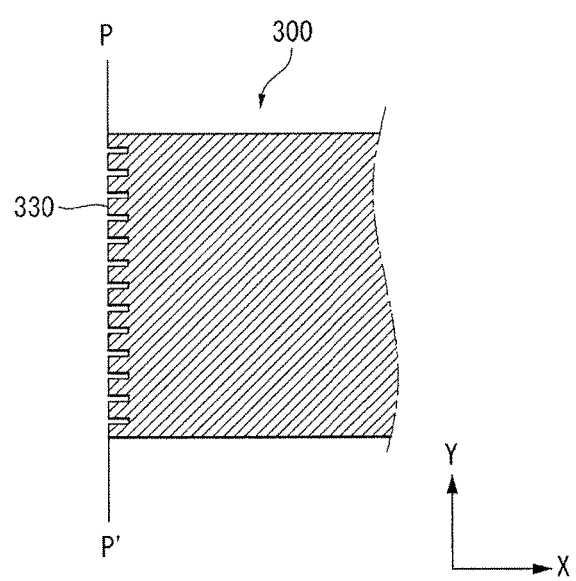
Figure 20:
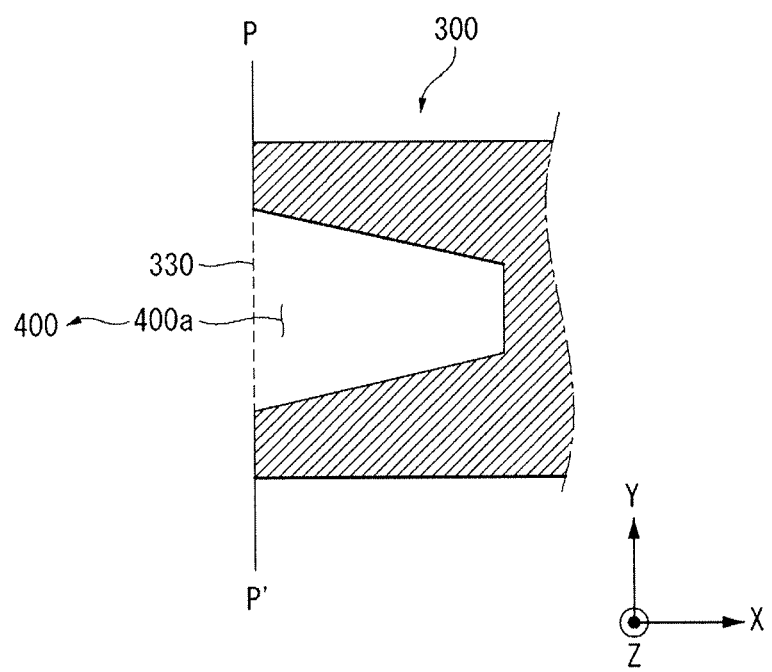

FIGS. 18 to 20 show various embodiments of a cross-section formed by cutting the conductive cover of FIG. 12 along P-P' direction.

A thickness surface 330 or the lateral surfaces on either of gap/slit 305 of the conductive cover 300 shown in FIG. 18 may be a thickness surface 330 where the cavity 400 is not located. A thickness surface 330 of the conductive cover 300 shown in FIG. 18 may be a thickness surface 330 before the cavity 400 is formed.

A thickness surface 330 of the conductive cover 300 shown in FIG. 19 may be a thickness surface 330 etched on the thickness surface 330 of the conductive cover 300 shown in FIG. 18 (e.g., thin grooves may be etched into the lateral surface to provide a scored texture for better adhesive with the dielectric member). The etching treatment of the thickness surface 330 shown in FIG. 19, for example, may use a laser. The thickness surface 330 shown in FIG. 19 may have a groove shape.

A thickness surface 330 of the conductive cover 300 shown in FIG. 20 may be a thickness surface 330 where the cavity 400 is formed. A first cavity 400a shown in FIG. 20 may be symmetrical about the line P-P'.

A cavity 400 may have a varying cross section in a depression direction from the thickness surface 330 (e.g., the cross section of cavity 400 may vary as the cavity extends into a lateral side surface of the conductive member). The cross section of the cavity 400 may refer to a cross section perpendicular to the depression direction of the cavity 400 from the thickness surface 330.

As the cavity 400 is depressed, the cross section perpendicular to the depression direction may become smaller. In other words, the cavity 400 may have a narrowing cross section in the depression direction from the thickness surface 330. For example, the cavity 400 may have a shape of a truncated cone. FIG. 20 may represent a cross section formed by cutting the first cavity 400a shown in FIG. 12 along P-P' direction. The P-P' direction may be parallel to the depth direction of the slit 305 or the opening 301. Alternatively, the P-P' direction may be parallel with the direction toward the exterior surface 320 from the interior surface 310 of the conductive cover 300.

The depression direction of the cavity 400 may refer to the length direction of the cavity 400. The length direction of the cavity 400 may refer to a height or a depth of the cavity 400.

Figure 21:
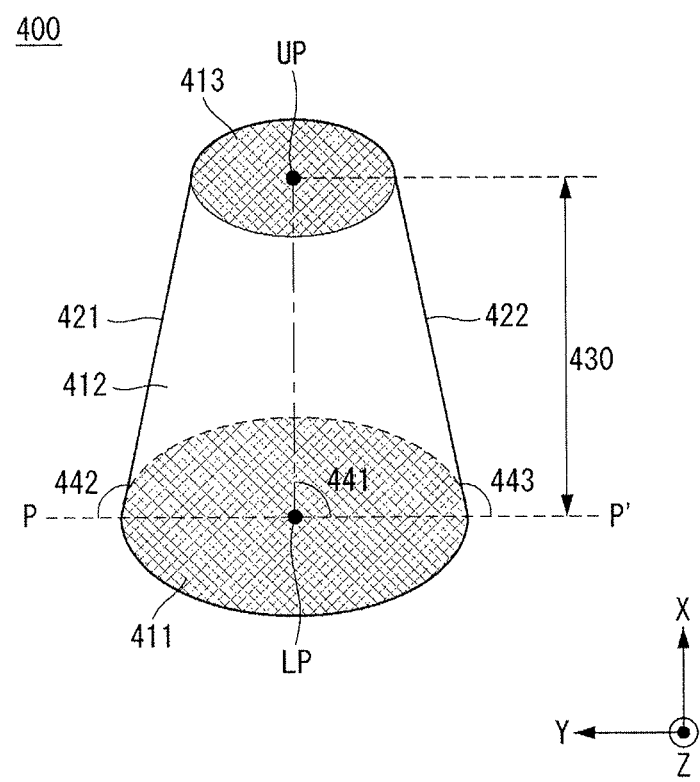
FIG. 21 is a perspective view of the cavity shown in FIG. 20.

FIG. 21 is a perspective view of the cavity 400 shown in FIG. 20. The cavity 400 shown in FIG. 21 is embossed (e.g., to form a textured surface). A shape of the cavity 400 shown in FIG. 21 may be a shape of the protrusion 345 of the dielectric member 340 which fills the cavity 400.

The cavity 400 may have a depth 430. The depth 430 of the cavity 400 may correspond to a height of the protrusion 345 of the dielectric member 340 which is filled in the cavity 400.

The cavity 400 may include a first surface 411, a second surface 412, and a third surface 413. The first surface 411 may be a portion of the thickness surface 330 before the cavity 400 is formed. The first surface 411 may be a surface of the cavity 400 which is connected to the outside. The first surface 411 may be a virtual surface. The first surface 411 may be a portion of a complete plane or a curved surface.

The third surface 413 may be a surface spaced apart from the first surface 411. The third surface 413 may be a surface opposite to the first surface 411 in interior surfaces of the cavity 400. The third surface 413 may be substantially perpendicular to the depression direction of the cavity 400. The third surface 413 may be a portion of a complete plane or a curved surface. An area of the third surface 413 may be smaller than an area of the first surface 411.

The second surface 412 may be a surface connecting the first surface 411 to the third surface 413. The second surface 412 may be a surface formed to the side of the depression direction of the cavity 400. The second surface 412 may form inclination with respect to the depression direction of the cavity 400.

A line segment connecting a point LP of the first surface 411 to a point UP of the third surface 413 may form an angle with the first surface 411 as a first angle 441. The point LP of the first surface 411 may represent a location of the first surface 411. The point UP of the third surface 413 may represent a location of the third surface 413. The point LP of the first surface 411 may be a weight center of the first surface 411. The point UP of the third surface 413 may be a weight center of the third surface 413.

A direction of the line segment connecting the point LP of the first surface 411 to the point UP of the third surface 413 may be associated with the depression direction of the cavity 400. That is, the first angle 441 may indicate the depression direction or a heading direction of the cavity 400. For example, as shown in FIG. 21, the first angle 441 may be 90 degree. The first angle 441 may refer to an angle which the protrusion 345 forms on the body 341 of the dielectric member 340.

The first angle 441 may affect the durability of the dielectric member 340 by affecting an overall shape of the dielectric member 340. For example, as the first angle 441 is formed at an acute angle (e.g., inclined with respect to the lateral surface), an external impact applied to the dielectric member 340 can easily be transmitted to the conductive cover 300 toward the interior surface 310 of the conductive cover 300 adjacent to the dielectric member 340. As the external impact applied to the dielectric member 340 is transmitted to the conductive cover 300, the dielectric member 340 can easily correspond to or absorb the external impact.

A first line 421 and a second line 422 may be formed on the second surface 412. The first line 421 and the second line 422 may be lines which are coincident with P-P' among lines which connect a circumference of the first surface 411 to a circumference of the third surface 413. The first line 421 and the second line 422 may be a factor that indicates a slope from a shape of the cavity 400. The first line 421 may be adjacent to the exterior surface 320 of the conductive cover 300 as compared to the second line 422. For example, the first line 421 may be adjacent to the P as compared to the second line 422.

The first line 421 and the second line 422 may form an angle with the thickness surface 330 of the conductive cover 300 in which the cavity 400 is formed. A second angle 442 may represent an angle which the first line 421 forms with the thickness surface 330. A third angle 443 may represent an angle which the second line 422 forms with the thickness surface 330.

The second angle 442 and the third angle 443 may be associated with the ratio of the first surface 411 to the depth 430. Here, "the first surface 411" may mean an area of the first surface 411. The smaller the second angle 442 and the third angle 443 are, the larger the ratio of the depth 430 to the first surface 411 is. The larger the second angle 442 and the third angle 443 are, the smaller the ratio of the depth 430 to the first surface 411 is.

The ratio of the depth 430 to the first surface 411 may be an aspect ratio of the cavity 400. The aspect ratio of the cavity 400 may have a negative correlation for a size of the second angle 442 and the third angle 443. The aspect ratio of the cavity 400 may be related to an overall shape or a form of the cavity 400.

When the second angle 442 increases and the third angle 443 decreases, the first angle 441 may decrease. In other words, when the second angle 442 increases and the third angle 443 decreases, the cavity 400 may have an inclined shape towards the interior surface 310 of the conductive cover 300.

When the second angle 442 decreases and the third angle 443 increases, the first angle 441 may increase. In other words, when the second angle 442 decreases and the third angle 443 increases, the cavity 400 may have an inclined shape towards the exterior surface 320 of the conductive cover 300.

Figure 22:
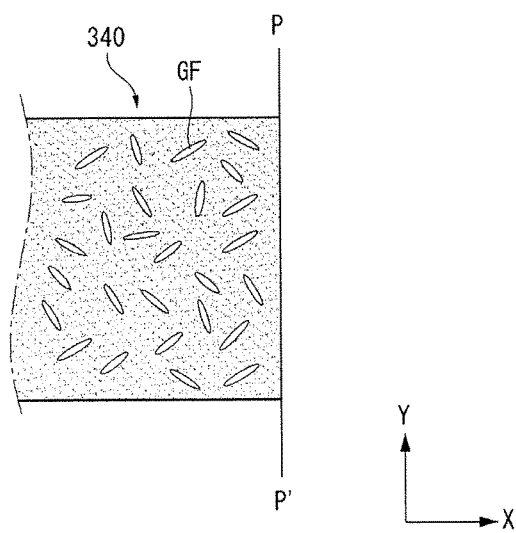
FIGS. 22 to 24 are diagrams showing dielectric members formed according to various embodiments of the present invention.
Figure 23:
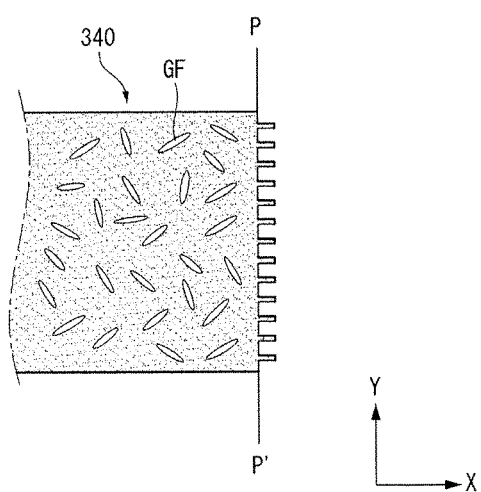
Figure 24:
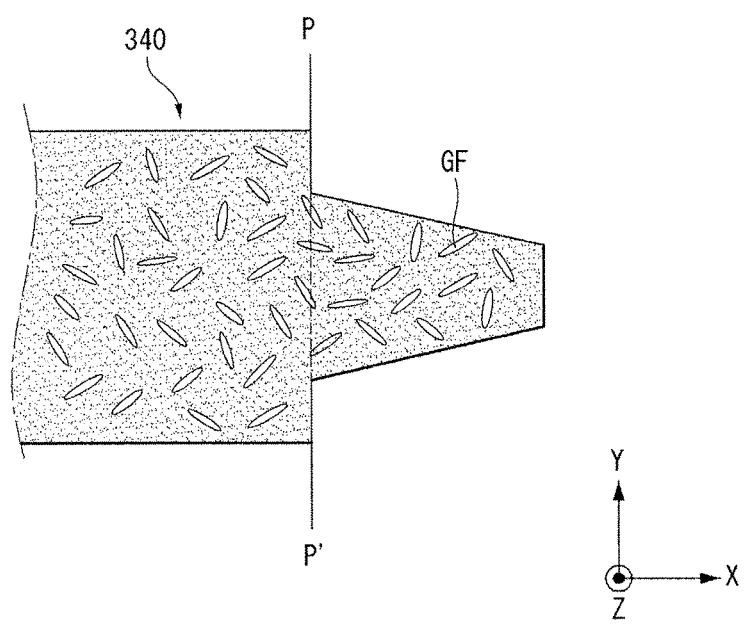

FIGS. 22 to 24 are diagrams showing dielectric members formed according to various embodiments of the present invention.

FIG. 22 shows a dielectric member 340 which is formed in contact with the thickness surface 330 or lateral surface 330 shown in FIG. 18. The dielectric member 340 may be a plastic as a polymer material. The dielectric member 340 may include a PBT (polybutylene terephthalate) resin. The PBT resin may perform an electrical insulation function. The PBT resin may have superior thermal and mechanical properties. The PBT resin may be easier to injection molding. The dielectric member 340 may include glass fibers GF. The glass fibers GF, for example, may include silicon dioxide. The glass fibers GF, for example, may have a length of 0.1 mm to 0.2 mm. The glass fibers GF, for example, may have a diameter of about 0.005 mm. The dielectric member 340 shown in FIG. 22 may be in contact with the thickness surface 330 that are not processed.

FIG. 23 shows a dielectric member 340 which is formed in contact with the thickness surface 330 shown in FIG. 19. The thickness surface 330 in contact with the dielectric member 340 may be etched. A size of the groove that is etched in the thickness surface 330, for example, may be 0.05 mm.

An area with which a dielectric member 340 shown in FIG. 23 is in contact with the thickness surface 330 may be greater than an area with which the dielectric member 340 shown in FIG. 22 is in contact with the thickness surface 330. A binding force on the thickness surface 330 of the dielectric member 340 shown in FIG. 23 may be greater than a binding force on the thickness surface 330 of the dielectric member 340 shown in FIG. 22.

A glass fiber GF contained in the dielectric member 340 shown in FIG. 23 may be longer than a size of the grooves formed in the thickness surface 330. As shown in FIG. 23, the glass fiber GF contained in the dielectric member 340 cannot be located in the grooves formed in the thickness surface 330.

FIG. 24 shows a dielectric member 340 which is formed in contact with the thickness surface 330 shown in FIG. 20. The cavity 400 may be formed in the thickness surface 330, and may be filled with the dielectric member 340. A diameter of the cavity 400, for example, may be about 0.5 mm. The cavity 400 may have a cross section and a depth, equal to or greater than a length of the glass fiber GF contained in the dielectric member 340. For example, the diameter of the cavity 400 may be greater than the length of the glass fiber GF contained in the dielectric member 340. The diameter of the cavity 400 may be large enough for the glass fiber GF contained in the dielectric member 340 to be easily injected into the cavity 400. A depth of the cavity 400 may be equal to or greater than the length of the glass fiber GF. The length of the glass fiber GF may mean an average of the length of the glass fiber GF contained in the dielectric member 340.

The dielectric member 340 shown in FIG. 24 may have not only a difference in the area in contact with the thickness surface 330 but also a structural difference as compared with the dielectric member 340 shown in FIG. 23. The glass fibers GF contained in the dielectric member 340 can provide a beneficial effect to rigidity securing of the dielectric member 340 by being injected into the cavity 400. The protrusion 345 of the dielectric member 340 formed inside the cavity 400 may include the glass fibers GF.

Figure 25:
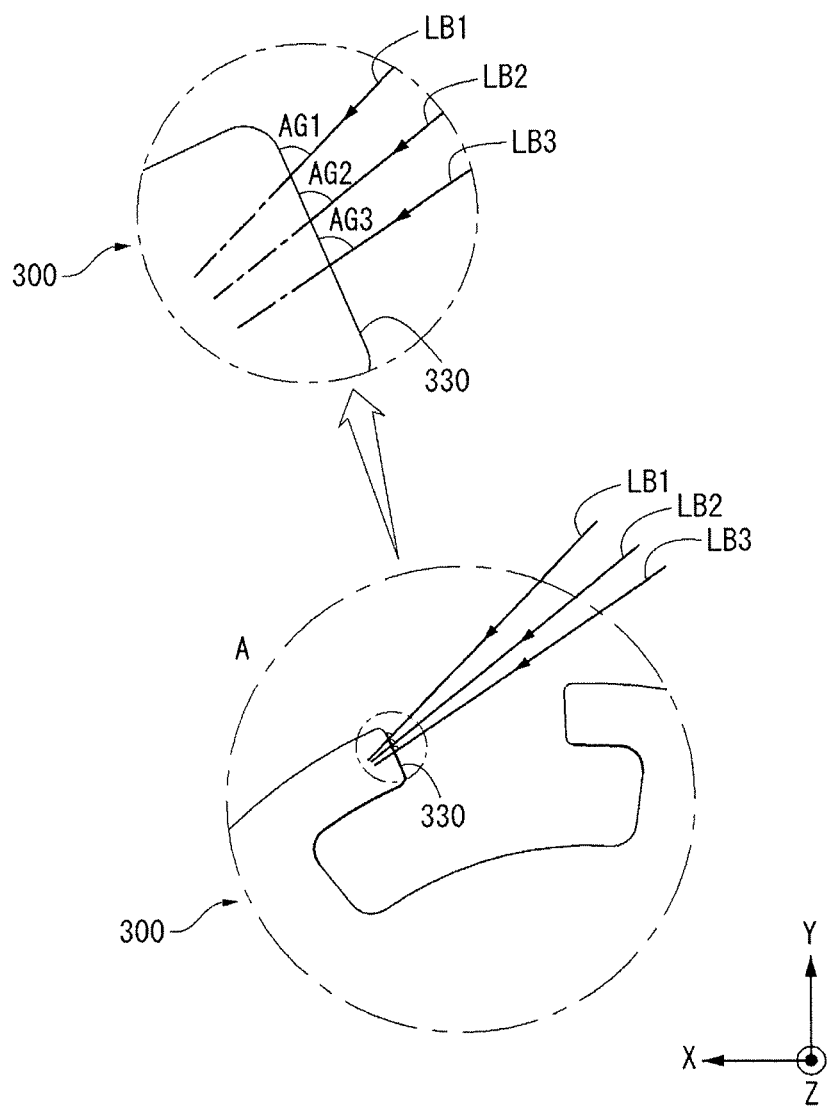
FIG. 25 is a schematic view showing a state of processing a cavity on the thickness surface of the area A shown in FIG. 11.

FIG. 25 is a schematic view showing a state of processing a cavity in the thickness surface of the area A shown in FIG. 11. As shown in FIG. 25, the cavity 400 formed on the thickness surface 330 may be processed by a laser beam. It may be difficult that an incidence angle of the laser beam is a right angle to the thickness surface 330 by the limit of the location of the surface thickness 330 to be processed. The cavity 400 may be inclined towards an interior surface.

The laser beam, for example, may include a first laser beam LB1, a second laser beam LB2, and a third laser beam LB3. The first laser beam LB1 may be located on the outermost side from the conductive cover 300. Third laser beam LB3 may be located most closely to the conductive cover 300. The second laser beam LB2 may be located between the laser beam LB1 and the third laser beam LB3. There may be a plurality of laser beams between the laser beam LB1 and the second laser beam LB2. There may be a plurality of laser beams between the laser beam LB2 and the third laser beam LB3.

The first laser beam LB1, the second laser beam LB2, and the third laser beam LB3 may have an incident angle to the thickness surface 330. The first laser beam LB1 may be incident at an angle of AG1 to the thickness surface 330. The second laser beam LB2 may be incident at an angle of AG2 to the thickness surface 330. The third laser beam LB3 may be incident at an angle of AG3 to the thickness surface 330.

AG1 may be smaller than AG2. AG2 may be smaller than AG3. A shape of the cavity 400 formed on the thickness surface 330 may be affected by the angle AG1, AG2, and AG3. The shape of the cavity 400 formed on the thickness surface 330 may be affected by output and exposure time of the laser beam that is incident on the thickness surface 330.

Figure 26:
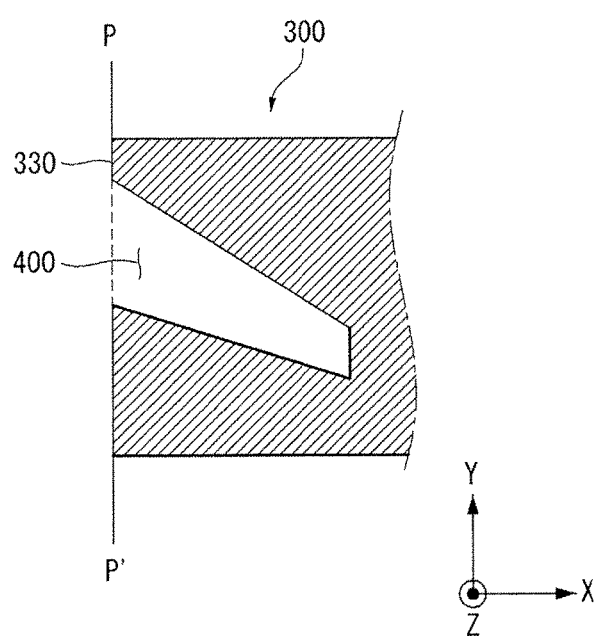
FIGS. 26 and 27 are diagrams showing the first cavity of FIG. 12, and represent a cavity of which a top and a bottom are not overlapped and having a truncated conical shape that is asymmetric in the P-P' direction.
Figure 27:
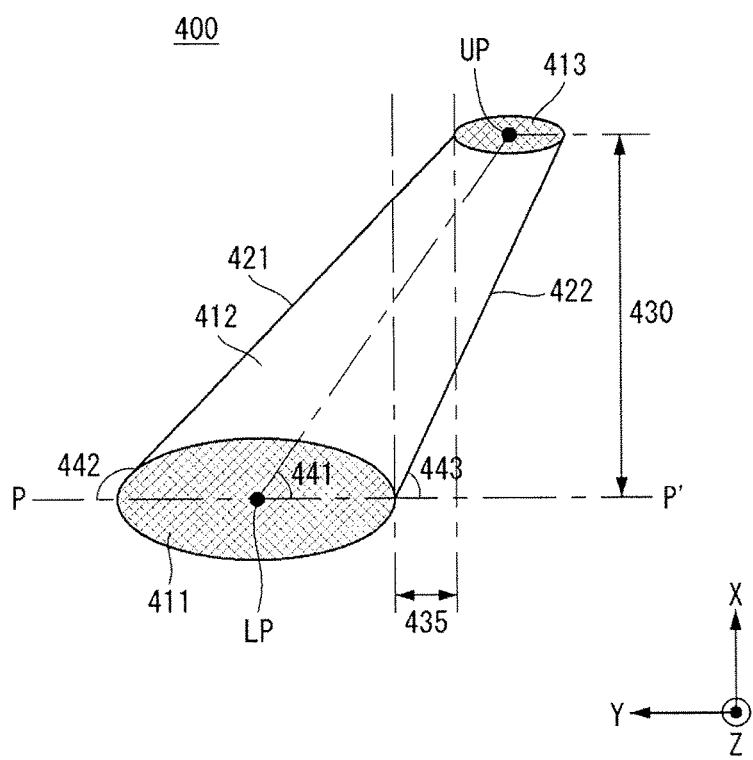

FIGS. 26 and 27 are diagrams showing the first cavity of FIG. 12, and represent a cavity of which top and bottom are not overlapped as a truncated conical shape that is asymmetric in the P-P' direction. The "top" of the cavity 400 may refer to the third surface 413 of the cavity 400. The "bottom" of the cavity 400 may refer to the first surface 411 of the cavity 400. As shown in FIG. 26, the cavity 400 may have an inclined shape towards the interior surface 310 of the conductive cover 300. In other words, the cavity 400 may be adjacent to the interior surface 310 as it proceeds in the depression direction (e.g., into the lateral surface 330). Here, the interior surface 310 may indicate a surface that is adjacent to the P' or a surface that is facing a negative Y-axis in FIG. 26.

FIG. 27 is a perspective view of the cavity 400 shown in FIG. 26. The cavity 400 shown in FIG. 27 is embossed. A shape of the cavity 400 shown in FIG. 27 may be a shape of the protrusion 345 of the dielectric member 340 which fills the cavity 400.

The cavity 400 shown in FIG. 27 may have a larger second angle 442, a small third angle 443 and a small first angle 441 as compared with the cavity 400 shown in FIG. 21. In other words, the first angle 441 may not be a right angle. When the first angle 441 is not a right angle, the cavity 400 may have a inclined and depression shape with respect to the interior surface 310 or the exterior surface 320 of the conductive cover 300. For example, when the first angle 441 is an acute angle, the cavity 400 may be a shape that proceeds toward the interior surface 310 of the conductive cover 300.

It may be considered whether the first surface 411 and the third surface 413 are overlapped in a direction toward an interior of the conductive cover 300 in the thickness surface 330 of the conductive cover 300. The direction toward the interior of the conductive cover 300 in the thickness surface 330 of the conductive cover 300 may mean a direction substantially perpendicular to the first surface 411. Hereafter, the overlap of the first surface 411 and third surface 413 may mean an overlap in the direction toward the interior of the conductive cover 300 in the thickness surface 330 of the conductive cover 300.

The first surface 411 may not overlap with the third surface 413. In other words, the first surface 411 may not overlap with the third surface 413 in the direction toward the interior of the conductive cover 300 in the thickness surface 330 of the conductive cover 300. That is, the first surface 411 may be spaced apart from the third surface 413 in a direction in which the first surface 411 is extended. A separation distance 435 of the first surface 411 from the third surface 413 may be a separation distance by which the first surface 411 may be spaced apart from the third surface 413 in a direction in which the first surface 411 is extended. The separation distance 435 may have a positive value. In other words, the positive separation distance 435 may mean the first surface 411 is spaced apart from the third surface 413 in a direction in which the first surface 411 is extended. When the separation distance 435 is larger, the first angle 441 may be smaller.

The cavity 400 may be formed on a space between the interior surface 310 and the exterior surface 320 of the conductive cover 300. When the first angle 441 is smaller, the depth 430 of the cavity 400 may be smaller. When the first angle 441 is smaller, the depression length of the cavity 400 may be smaller. When the first angle 441 is smaller, the height HT of the protrusion 345 of the dielectric member 340 which is filled in the cavity 400 may be smaller. When the height HT of the protrusion 345 of the dielectric member 340 is smaller, the durability against the external impact of the dielectric member 340 may be worsened. As mentioned above, an external impact on the dielectric member 340 which is filled in the cavity 400 affects transfer to the conductive cover 300, thereby the first angle 441 may be related to the durability against the external impact on the dielectric member 340. The first angle 441 may have an optimal value (or value range) with respect to "the height HT of the protrusion 345" and "transfer to the conductive cover 300 of the external impact."

Figure 28:
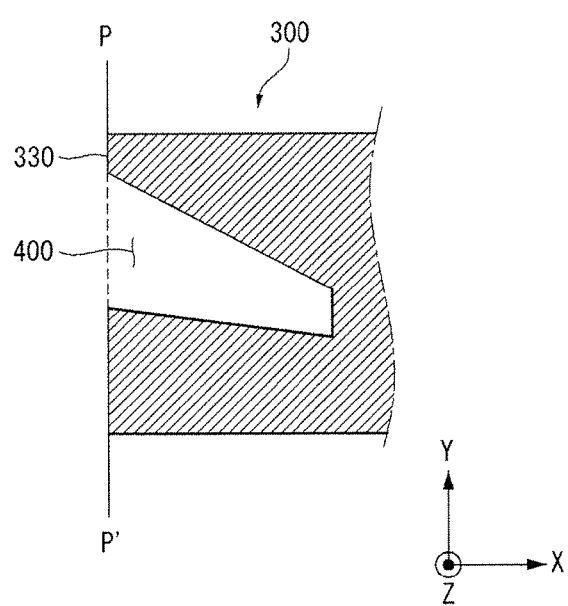
FIGS. 28 and 29 are diagrams showing the first cavity of FIG. 12, and represent a cavity of which a top and a bottom are overlapped and having a truncated conical shape that is asymmetric in the P-P' direction.
Figure 29:
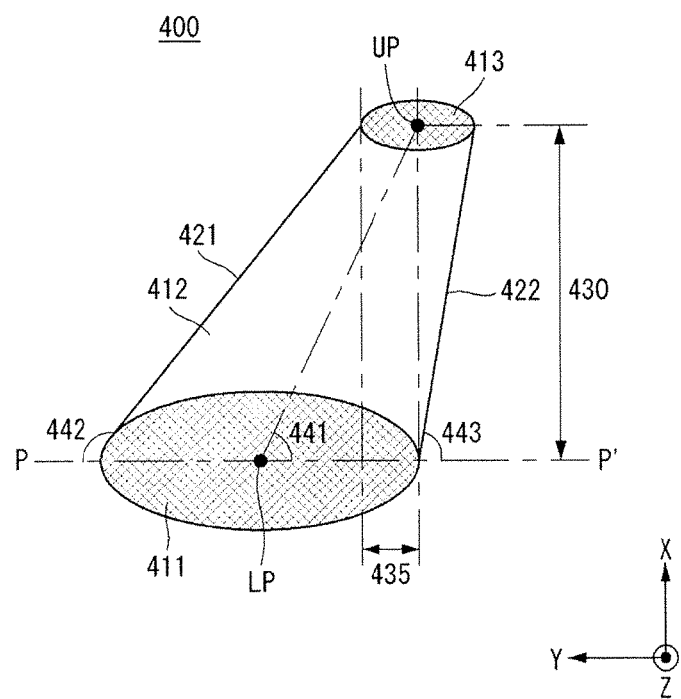

FIGS. 28 and 29 are diagrams showing the first cavity of FIG. 12, and represent a cavity of which a top and bottom are overlapped as a truncated conical shape that is asymmetric in the P-P' direction. The "top" of the cavity 400 may refer to the third surface 413 of the cavity 400. The "bottom" of the cavity 400 may refer to the first surface 411 of the cavity 400.

FIG. 29 is a perspective view of the cavity 400 shown in FIG. 28. The cavity 400 shown in FIG. 29 is embossed. A shape of the cavity 400 shown in FIG. 29 may be a shape of the protrusion 345 of the dielectric member 340 which fills the cavity 400.

An amount of overlap of the first surface 411 with the third surface 413 may be expressed by using the separation distance 435. As mentioned above, the positive separation distance 435 may indicate a separation distance by which the first surface 411 is spaced apart from the third surface 413. The negative separation distance 435 may indicate the amount of overlap of the first surface 411 with the third surface 413. The separation distance 435 shown in FIG. 29 may have a negative value.

The shape of the cavity 400 shown in FIG. 29 may be an intermediate shape between the cavity 400 shown in FIG. 21 and the cavity 400 shown in FIG. 27. The cavity 400 shown in FIG. 21 may secure a sufficient depth 430 of the cavity. The cavity 400 shown in FIG. 21 may not be able to sufficiently transfer an external impact to the conductive cover 300. The cavity 400 shown in FIG. 27 may easily transfer an external impact to the conductive cover 300. The cavity 400 shown in FIG. 27 may not easily secure a sufficient depth 430 of the cavity. The cavity 400 shown in FIG. 29 can secure a depth 430 of the cavity and easily transfer an external impact to the conductive cover 300.

Figure 30:
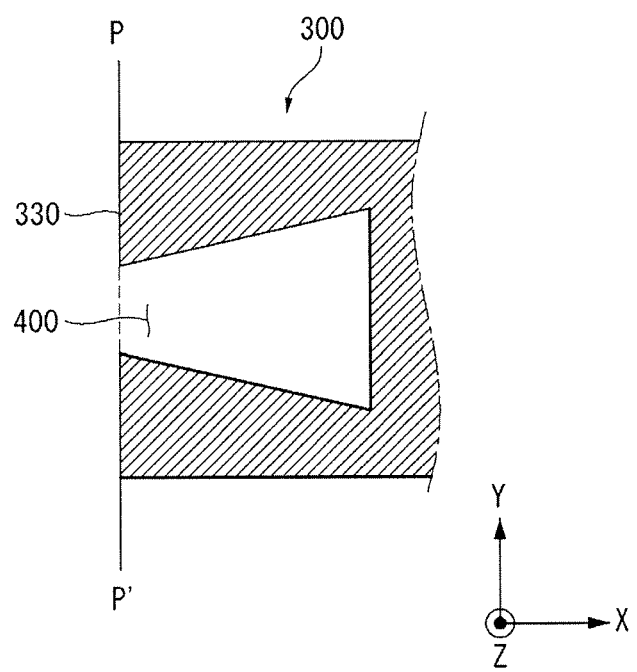
FIGS. 30 and 31 are diagrams showing the first cavity of FIG. 12, and represent a cavity having a cross section that becomes larger as the cavity is depressed.
Figure 31:
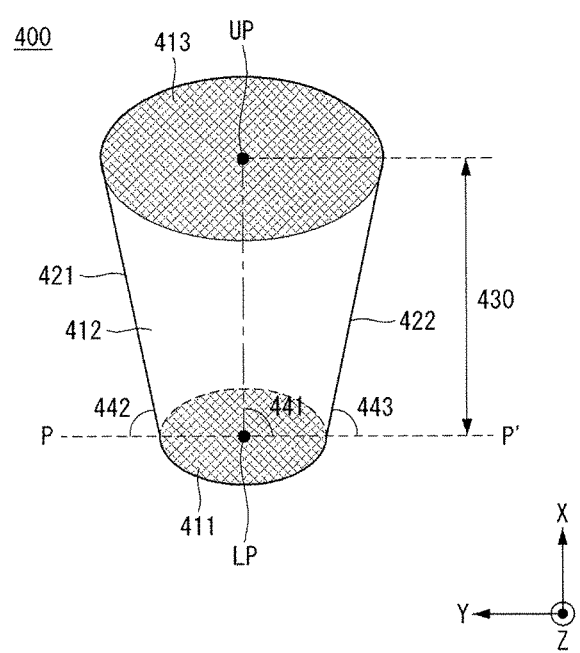

FIGS. 30 and 31 are diagrams showing the first cavity of FIG. 12, and represent a cavity of which cross section becomes larger as the cavity is depressed. For example, the FIG. 31 is a perspective view of the cavity 400 shown in FIG. 30. The cavity 400 shown in FIG. 31 is embossed. A shape of the cavity 400 shown in FIG. 31 may be a shape of the protrusion 345 of the dielectric member 340 which fills the cavity 400.

As the cavity 400 heads toward the interior of the conductive cover 300 from the thickness surface 330, a cross section of the cavity 400 may be larger. The conductive cover 300 which overlaps with the cavity having the cross section which is larger as the cavity 400 heads toward the interior of the conductive cover 300 may have a smaller cross section as the cavity 400 heads toward the interior of the conductive cover 300 from the thickness surface 330. For example, the cavity can have a reverse tapered shape having a width that becomes larger as the first cavity extends from the gap into a lateral surface of the conductive cover. In other words, a thickness of an area of the conductive cover 300 adjacent to the third surface 413 of the cavity 400 may be thinner than a thickness of an area of the conductive cover 300 adjacent to the first surface 411 of the cavity 400.

A protrusion 345 of the dielectric member 340 filled in the cavity 400 may be a shape of the cavity 400 shown in FIG. 31. The protrusion 345 may take on the conductive cover 300 in the direction toward the thickness surface 330 from the interior of the conductive cover 300 due to the shape shown in FIG. 31. In other words the protrusion 345, by the conductive cover 300, may have an obstacle in the process of the protrusion 345 toward the thickness surface 330 from the interior of the conductive cover 300.

The shape of the cavity 400 shown in FIG. 31 may affect a thickness profile of the conductive cover 300. By the shape of the cavity 400, the conductive cover 300 area adjacent to the third surface 413 may be weak to an external impact. Further, by the shape of the cavity 400, the dielectric member 340 can be stably fixed to the interior of the conductive cover 300 with respect to the direction toward the thickness surface 330 from the interior of the conductive cover 300.

Figure 32:
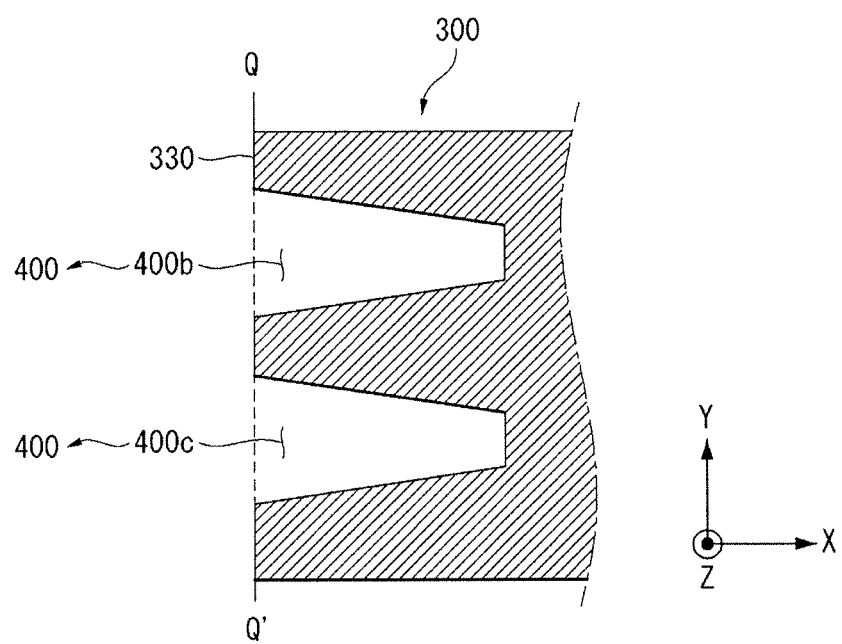
FIGS. 32 and 33 are diagrams showing the second cavity and the third cavity of FIG. 12, and represent a plurality of cavities in which the depression direction of the second cavity and the third cavity are parallel to each other.
Figure 33:
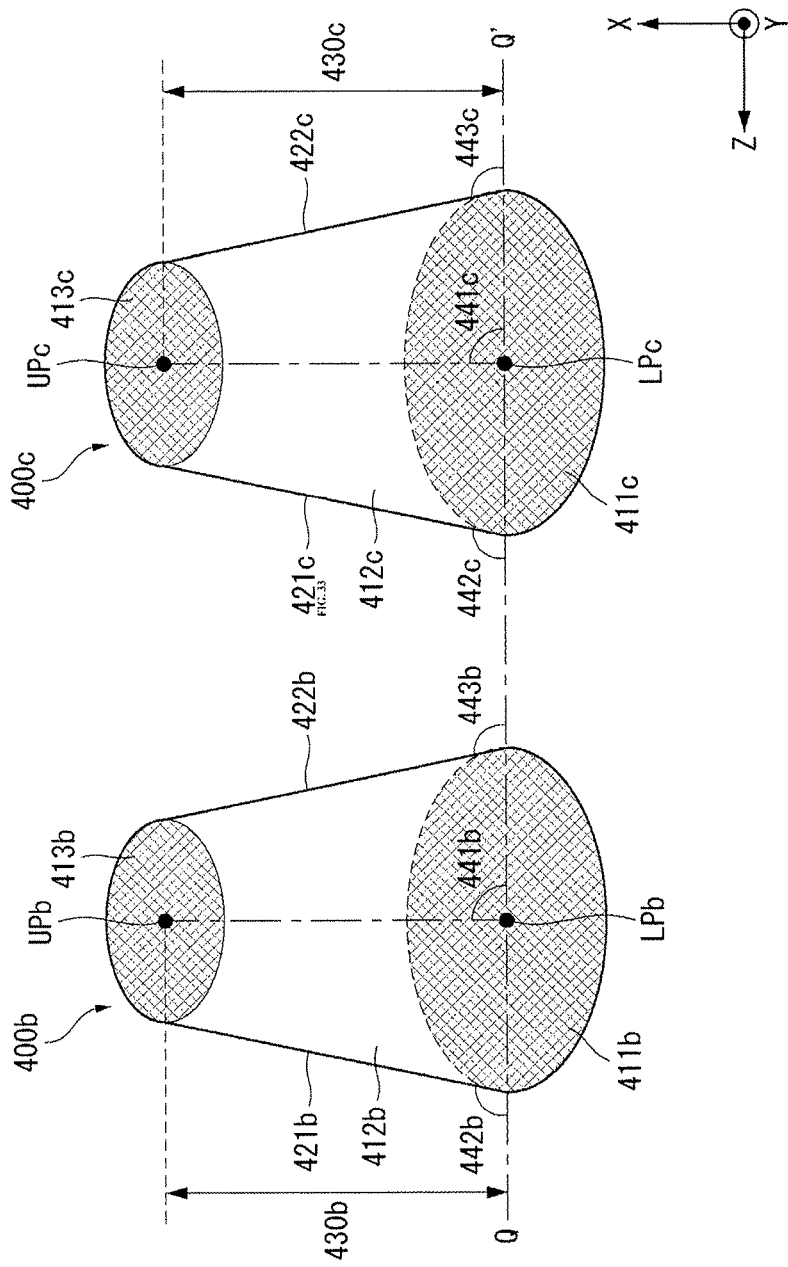

FIGS. 32 and 33 are diagrams showing the second cavity and the third cavity of FIG. 12, and represent a plurality of cavities of which depression direction of the second cavity and the third cavity are parallel to each other. FIG. 33 is a perspective view of the cavity 400 shown in FIG. 32. The cavity 400 shown in FIG. 33 is embossed. A shape of the cavity 400 shown in FIG. 33 may be a shape of the protrusion 345 of the dielectric member 340 which fills the cavity 400.

The second cavity 400b and the third cavity 400c may be formed on the one thickness surface 330 (e.g., on the same lateral surface). The second cavity 400b and the third cavity 400c may have a length direction parallel to each other. The second cavity 400b and the third cavity 400c may not be overlapped with each other (e.g., they can be off set). In FIG. 33, a sign of a component of the second cavity 400b may be expressed by attaching "b" to the sign of the component corresponding to the cavity 400. In FIG. 33, a sign of a component of the third cavity 400c may be expressed by attaching "c" to the sign of the component corresponding to the cavity 400.

The second cavity 400b and the third cavity 400c are not overlapped with each other, are substantially parallel to each other, and may not affect each other. When an impact is applied on the mobile terminal 10 from the outside, an amount of the impact applied on the second cavity 400b and the third cavity 400c may be changed according to a point of the external impact. For example, when an impact is applied on the mobile terminal 10 adjacent the second cavity 400b, an amount of the impact applied on the second cavity 400b may be greater than an amount of the impact applied on the third cavity 400c.

Figure 34:
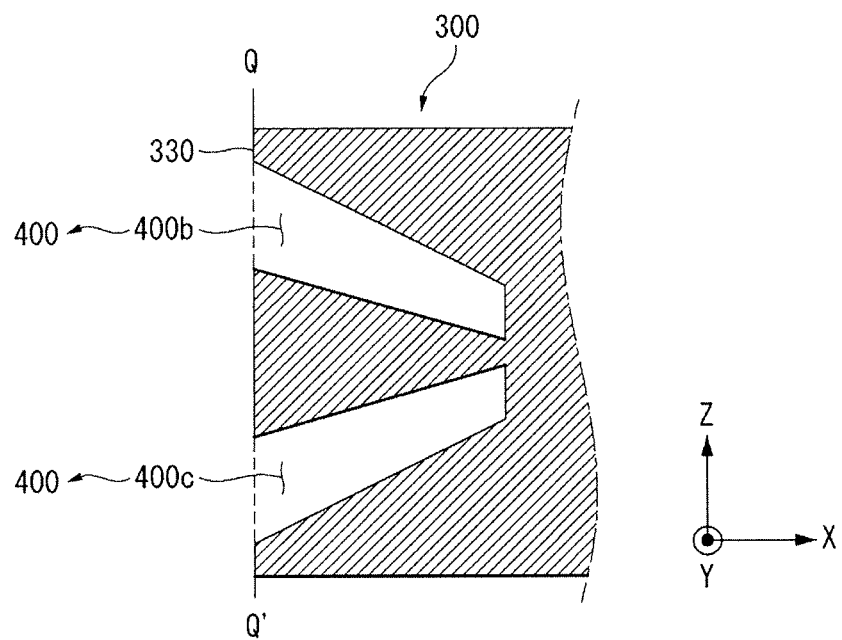
FIGS. 34 and 35 are diagrams showing the second cavity and the third cavity of FIG. 12, and represent a plurality of cavities having shapes that approach each other in a depression direction.
Figure 35:
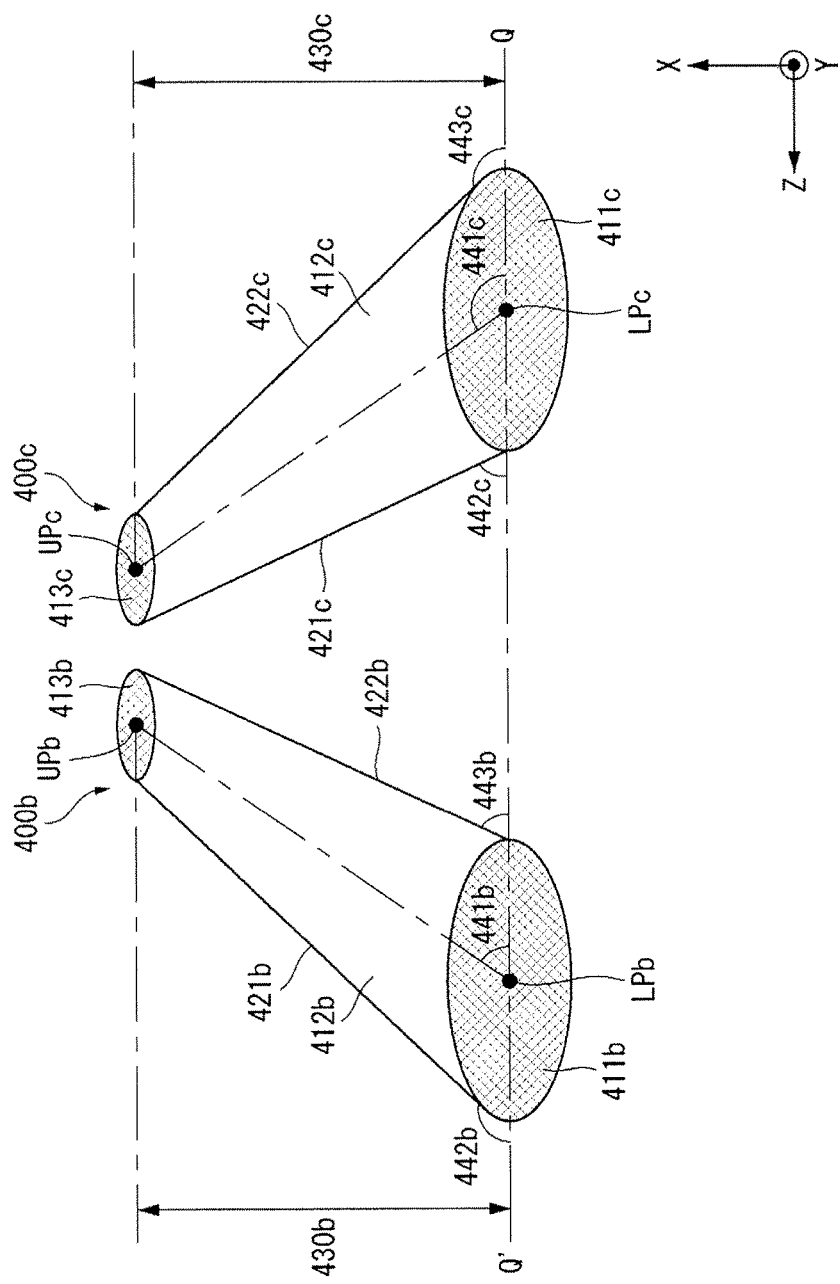

FIGS. 34 and 35 are diagrams showing the second cavity and the third cavity of FIG. 12, and represent a plurality of cavities of which shapes approach each other in a depression direction. FIG. 35 is a perspective view of the cavity 400 shown in FIG. 34. The cavity 400 shown in FIG. 35 is embossed. A shape of the cavity 400 shown in FIG. 35 may be a shape of the protrusion 345 of the dielectric member 340 which fills the cavity 400.

The second cavity 400b and the third cavity 400c may be formed on the one thickness surface 330. The second cavity 400b and the third cavity 400c may approach each other in a depression direction. The second cavity 400b and the third cavity 400c may not be overlapped with each other. In FIG. 35, a sign of a component of the second cavity 400b may be expressed by attaching "b" to the sign of the component corresponding to the cavity 400. In FIG. 35, a sign of a component of the third cavity 400c may be expressed by attaching "c" to the sign of the component corresponding to the cavity 400.

Referring to FIG. 12 and FIG. 25, the second cavity 400b is processed with a laser beam from the rear surface of the conductive cover 300 and may be formed. Referring to FIG. 12 and FIG. 25, the third cavity 400c is processed with a laser beam from the front surface of the conductive cover 300 and may be formed. The second cavity 400b and the third cavity 400c may be configured to overcome the limitations due to the shape of the opening on the conductive cover 300 and may be formed.

Figure 36:
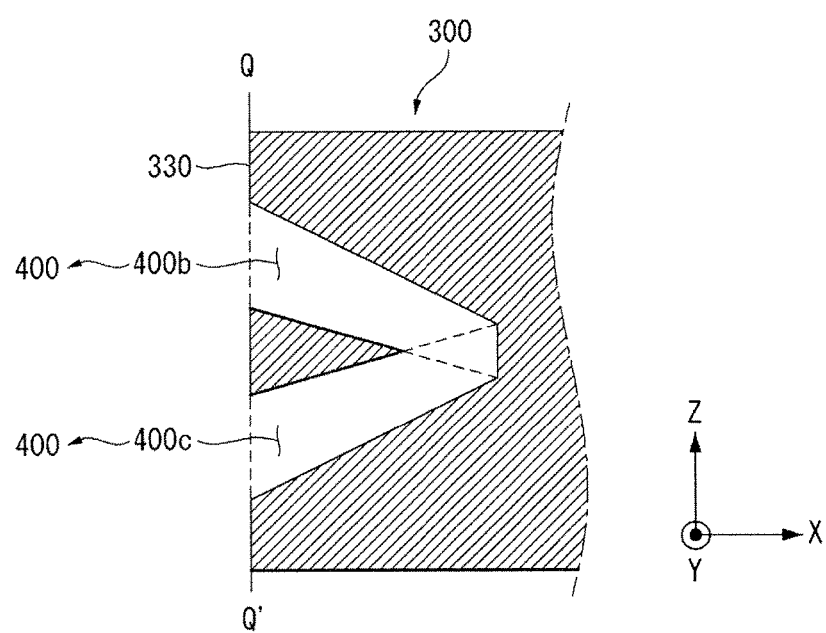
FIGS. 36 and 37 are diagrams showing the second cavity and the third cavity of FIG. 12, and represent a plurality of cavities having shapes that connect the second cavity to the third cavity.
Figure 37:
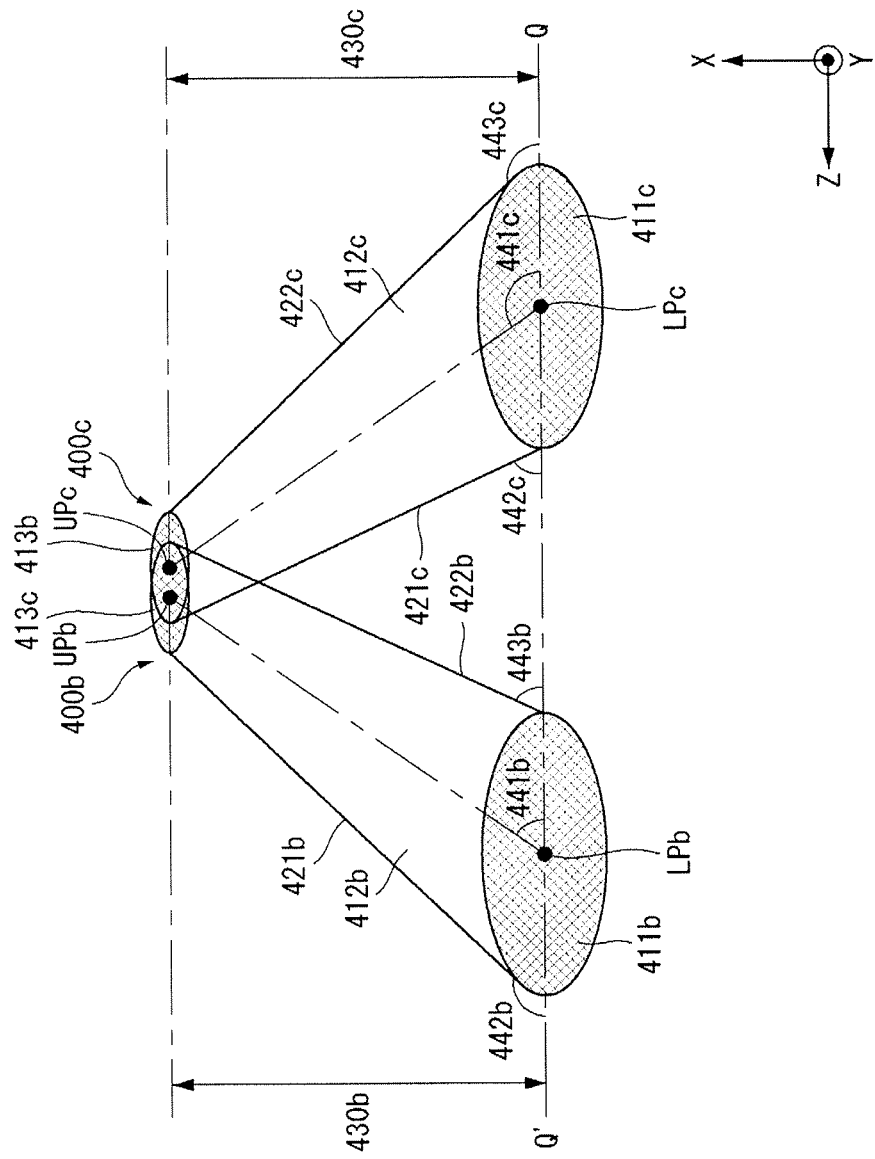

FIGS. 36 and 37 are diagrams showing the second cavity and the third cavity of FIG. 12, and represent a plurality of cavities of which shapes connect the second cavity to the third cavity. FIG. 37 is a perspective view of the cavity 400 shown in FIG. 36. The cavity 400 shown in FIG. 37 is embossed. A shape of the cavity 400 shown in FIG. 37 may be a shape of the protrusion 345 of the dielectric member 340 which fills the cavity 400.

The second cavity 400b and the third cavity 400c may be formed on the one thickness surface 330. The second cavity 400b and the third cavity 400c may approach each other and have a shape which connects the second cavity to the third cavity in a depression direction. In FIG. 37, a sign of a component of the second cavity 400b may be expressed by attaching "b" to the sign of the component corresponding to the cavity 400. In FIG. 37, a sign of a component of the third cavity 400c may be expressed by attaching "c" to the sign of the component corresponding to the cavity 400.

A shape of the protrusion 345 of the dielectric member 340 which fills the cavity 400 may have a shape in which two protrusions 345 meet and connect. The third surface 413b of the second cavity 400b and the third surface 413c of the third cavity 400c may overlap each other.

An overall shape of the dielectric member 340 may be a ring-like connecting shape to one side of the conductive cover 300. Alternatively, the dielectric member 340 may have a topology of the ring. Alternatively, the dielectric member 340 may have a topology that a plurality of rings are coupled. The dielectric member 340 may be coupled more stably to the conductive cover 300 by having such a structure.

Figure 38:
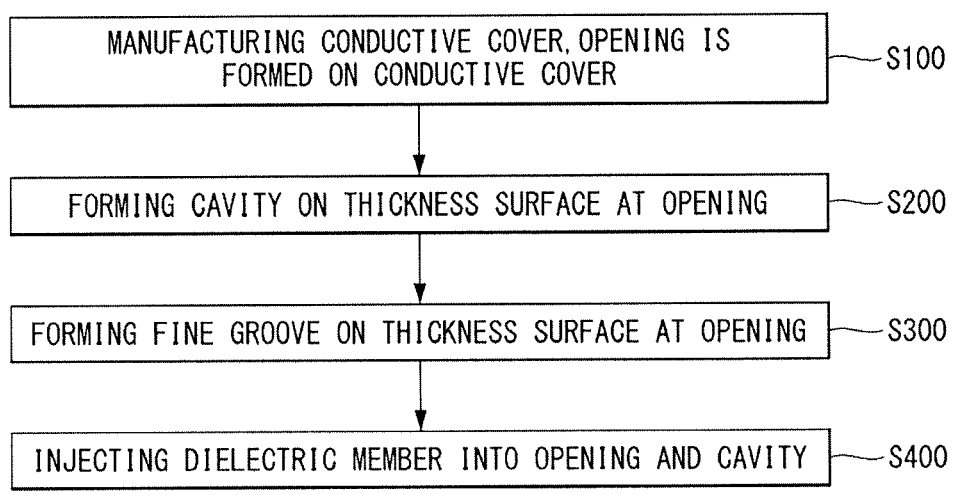
FIG. 38 is a flowchart illustrating a method for manufacturing a case of a mobile terminal according to an embodiment of the present invention.

FIG. 38 is a flowchart illustrating a method for manufacturing a case of a mobile terminal according to an embodiment of the present invention.

The method for manufacturing a case of a mobile terminal according to an embodiment of the present invention S10 may comprise a step S100 for manufacturing a conductive cover, an opening or gap is formed on the conductive cover, wherein the conductive cover includes an interior surface, an exterior surface, and a thickness surface (e.g., lateral surface) extended toward the exterior surface from the interior surface. The case of the mobile terminal may comprise a conductive cover. The conductive cover may cover at least a portion of the mobile terminal. The conductive cover may form an appearance of the mobile terminal. At least a portion of the conductive cover may be made of metal. The conductive cover may be manufactured by casting method. The conductive cover may be manufactured by press working method.

The method for manufacturing a case of a mobile terminal according to an embodiment of the present invention S10 may comprise a step S200 of forming a cavity on the thickness surface at the opening. The conductive cover may include an exterior surface facing exterior of the mobile terminal, an interior surface facing interior of the mobile terminal, and a thickness surface extended toward the exterior surface from one side of the interior surface. An opening may be located on the thickness surface in which the cavity is formed. The cavity may be formed by using a laser beam on the thickness surface at the opening.

The method for manufacturing a case of a mobile terminal according to an embodiment of the present invention S10 may comprise a step S300 of forming a fine groove or fine grooves on the thickness surface at the opening. The fine groove(s) may be formed by a laser beam, a patterning of chemicals, or mechanical working on the thickness surface at the opening.

The method for manufacturing a case of a mobile terminal according to an embodiment of the present invention S10 may comprise a step S400 of injecting a dielectric member into the opening and the cavity. The dielectric member may be formed by injection molding.

The embodiments or any other embodiments of the present invention described above are not intended to be exclusive or distinguished from each other. The embodiments or any other embodiments of the present invention described above may be used together or in combination.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A mobile terminal comprising:
a display;

a case including a conductive member having a first section and a second section, the first section having a first lateral surface and the second section having a second lateral surface;

a dielectric member positioned between the first section and the second section;

a gap formed between the first lateral surface and the second lateral surface, the gap filled with the dielectric member; and a first cavity formed on the first lateral surface of the first section, the first cavity recessed from the first lateral surface of the first section, and the first cavity filled with the dielectric member, wherein the first cavity forms an inclined angle with respect to the first lateral surface of the first section, and wherein a side of the first cavity forms an inclined angle with respect to the first lateral surface of the first section.

2. The mobile terminal according to claim 1, further comprising:

an earphone jack formed in the dielectric member and between the first and second sections of the conductive member.

3. The mobile terminal according to claim 1, wherein the first cavity has a conical shape with a varying cross section, a rounded shape or an oval shape.

4. The mobile terminal according to claim 1, wherein the first lateral surface is a flat surface or a curved surface.

5. The mobile terminal according to claim 1, further comprising:

a second cavity extending into the first lateral surface of the first section, wherein the dielectric member fills the second cavity.

6. The mobile terminal according to claim 5, wherein the first and second cavities approach each other.

7. The mobile terminal according to claim 6, wherein the first cavity is connected to the second cavity.

8. The mobile terminal according to claim 1, wherein the dielectric member includes a resin and a plurality of glass fibers.

9. The mobile terminal according to claim 8, wherein the first cavity has a length equal to or greater than lengths of the plurality of glass fibers, and wherein the plurality of glass fibers are disposed outside of the first cavity.

10. The mobile terminal according to claim 1, wherein the first cavity extends toward an interior of the mobile terminal and terminates at a truncated end, and wherein the truncated end of the first cavity forms a flat surface.

11. The mobile terminal according to claim 1, wherein the first cavity has a reverse tapered shape having a width that becomes larger as the first cavity extends into the first section of the conductive member.

12. The mobile terminal according to claim 1, wherein the first lateral surface is etched with grooves, and wherein the dielectric member fills the grooves etched into the first lateral surface.

13. The mobile terminal according to claim 1, wherein the dielectric member forms a plug between the first and second lateral surfaces and has a first peg extending from a side of the plug, wherein the first peg fills the first cavity, and wherein a length of the first peg is shorter than a length of the plug between the first and second lateral surfaces.

14. A mobile terminal comprising:

a display;

a case including a conductive member having a first section and a second section, the first section having a first lateral surface and the second section having a second lateral surface;

a dielectric member separating the first section from the second section;

a gap formed between the first lateral surface and the second lateral surface;

a first cavity extending into the first lateral surface of the first section; and a second cavity extending into the second lateral surface of the second section, wherein the first cavity forms an inclined angle with respect to the first lateral surface of the first section, and wherein a side of the first cavity forms an inclined angle with respect to the first lateral surface of the first section.

15. The mobile terminal according to claim 14, wherein the dielectric member forms a rectangular shaped plug having a first peg and a second peg extending from opposite sides of the rectangular shaped plug, and wherein the first peg fills the first cavity and the second peg fills the second cavity.

16. The mobile terminal according to claim 14, further comprising:

an earphone jack formed in the dielectric member and between the first and second sections of the conductive member.

17. A method of manufacturing a case of a mobile terminal, the method comprising:

forming a gap between a first lateral surface of a first section and a second lateral surface of a second section of a conductive member of the case;

forming a first cavity extending into the first lateral surface of the first section; and injecting a dielectric member into the gap and the first cavity, wherein the first cavity forms an inclined angle with respect to the first lateral surface of the first section, and wherein a side of the first cavity forms an inclined angle with respect to the first lateral surface of the first section.

18. The method according to claim 17, further comprising:

etching a plurality of grooves into the first lateral surface of the first section after forming the gap, wherein the dielectric member fills the grooves etched into the first lateral surface.

19. The method according to claim 17, wherein the first cavity is formed by irradiating a laser into the first lateral surface of the first section.

* * * * *